US012456397B2

(12) United States Patent
Ichikawa

(10) Patent No.: US 12,456,397 B2
(45) Date of Patent: Oct. 28, 2025

(54) DISPLAY DEVICE AND ELECTRONIC APPARATUS

(71) Applicant: Sony Semiconductor Solutions Corporation, Kanagawa (JP)

(72) Inventor: Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 447 days.

(21) Appl. No.: 18/021,890

(22) PCT Filed: Aug. 11, 2021

(86) PCT No.: PCT/JP2021/029660
§ 371 (c)(1),
(2) Date: Feb. 17, 2023

(87) PCT Pub. No.: WO2022/064891
PCT Pub. Date: Mar. 31, 2022

(65) Prior Publication Data
US 2023/0320179 A1 Oct. 5, 2023

(30) Foreign Application Priority Data
Sep. 25, 2020 (JP) .................... 2020-161010

(51) Int. Cl.
*H10K 59/80* (2023.01)
*G09F 13/22* (2006.01)
*H10K 102/00* (2023.01)

(52) U.S. Cl.
CPC .......... *G09F 13/22* (2013.01); *H10K 59/876* (2023.02); *H10K 59/878* (2023.02);
(Continued)

(58) Field of Classification Search
None
See application file for complete search history.

(56) References Cited

U.S. PATENT DOCUMENTS

2016/0259223 A1 9/2016 Bae

FOREIGN PATENT DOCUMENTS

JP 2007102181 A 4/2007
JP 2008234933 A 10/2008
(Continued)

OTHER PUBLICATIONS

International Search Report (PCT/ISA/210), International Application No. PCT/JP2021/029660, dated Oct. 19, 2021.

Primary Examiner — Anthony Ho
(74) Attorney, Agent, or Firm — Michael Best & Friedrich LLP

(57) ABSTRACT

Provided is a display device capable of curbing degradation of color purity.
The display device includes: a plurality of first electrodes that are two-dimensionally disposed; a second electrode that is provided to face first surfaces of the plurality of first electrodes; an electroluminescence layer that is provided between the plurality of first electrodes and the second electrode; an insulating layer that is provided between the adjacent first electrodes; and a plurality of reflective plates that are provided to second surfaces of the plurality of first electrodes, respectively. A plurality of resonator structures that resonate light emitted from the electroluminescence layer are configured of the second electrode and the plurality of reflective plates. The insulating layer includes a plurality of openings, and the openings are provided above the first surfaces of the first electrodes. The reflective plates include counter surfaces that face the electroluminescence layer via the first electrodes. In a case where regions corresponding to the openings in a plan view are defined as first regions, and regions corresponding to peripheral edge parts of the openings in the plan view are defined as second regions, a reflectance R1 on the counter surfaces in the first regions and
(Continued)

a reflectance R2 on the counter surfaces in the second regions satisfy a relationship of R2<R1.

20 Claims, 28 Drawing Sheets

(52) U.S. Cl.
CPC . *H10K 59/80515* (2023.02); *H10K 59/80521* (2023.02); *H10K 2102/351* (2023.02)

(56) References Cited

FOREIGN PATENT DOCUMENTS

| | | | |
|---|---|---|---|
| JP | 2009054507 | A | 3/2009 |
| JP | 2013165014 | A | 8/2013 |
| JP | 2015026561 | A | 2/2015 |
| JP | 2015149258 | A | 8/2015 |
| JP | 2017182892 | A | 10/2017 |
| JP | 2020098777 | A | 6/2020 |
| KR | 20090106099 | A | 10/2009 |
| KR | 20110029311 | A | 3/2011 |
| KR | 20190070192 | A | 6/2019 |
| KR | 102075728 | B1 | 2/2020 |
| WO | WO-2020110944 | A1 | 6/2020 |
| WO | 2020166511 | A1 | 8/2020 |

A

B

A

B

C

D

DISPLAY DEVICE AND ELECTRONIC APPARATUS

TECHNICAL FIELD

The present disclosure relates to a display device and an electronic apparatus including the same.

BACKGROUND ART

In recent years, organic EL (electroluminescence) display devices (hereinafter, simply referred to as "display devices") have been increasingly applied not only to direct viewing-type display devices such as monitors but also to ultra-small display devices (microdisplays) required to have pixel pitches of several microns.

For such display devices, development of a technology for efficiently extracting light has been strongly required. This is because the amount of actually emitted light in organic EL elements is not effectively used and this may cause a large loss in terms of power consumption if the light extraction efficiency is low.

Therefore, a technology for improving light extraction efficiency has been studied for such display devices. For example, PTL 1 proposes a resonator structure that causes a standing wave between a reflective layer and a counter electrode by setting an optical distance from the reflective layer to the counter electrode (translucent reflective layer) to a predetermined value in order to improve light extraction efficiency.

CITATION LIST

Patent Literature

[PTL 1]
JP 2015-26561 A

SUMMARY

Technical Problem

However, a display device having the resonator structure has a problem that light with a different color from that of sub-pixels is extracted at peripheral edge parts of the sub-pixels and color purity is degraded.

An object of the present disclosure is to provide a display device capable of curbing degradation of color purity and an electronic apparatus including the same.

Solution to Problem

In order to solve the above-described problems, a first disclosure is a display device including: a plurality of first electrodes that are two-dimensionally disposed; a second electrode that is provided to face first surfaces of the plurality of first electrodes; an electroluminescence layer that is provided between the plurality of first electrodes and the second electrode; insulating layers that are provided between the adjacent first electrodes; and a plurality of reflective plates that are provided to face second surfaces of the plurality of first electrodes, respectively, in which a plurality of resonator structures for resonating light emitted from the electroluminescence layer are configured of the second electrode and the plurality of reflective plates, the insulating layers have a plurality of openings, the openings are provided above the first surfaces of the first electrodes, the reflective plates have counter surfaces that face the electroluminescence layer via the first electrodes, and in a case where regions corresponding to the openings in a plan view are defined as first regions and regions corresponding to peripheral edge parts of the openings in the plan view are defined as second regions, a reflectance R1 on the counter surfaces in the first region and a reflectance R2 on the counter surfaces in the second regions satisfy a relationship of R2<R1.

A second disclosure is a display device including: a plurality of first electrodes that are two-dimensionally disposed; a second electrode that is provided to face first surfaces of the plurality of first electrodes; an electroluminescence layer that is provided between the plurality of first electrodes and the second electrode; insulating layers that are provided between the adjacent first electrodes; a plurality of reflective plates that are provided to face second surfaces of the plurality of first electrodes, respectively; and an adsorption layer that is provided on a side of a first surface or a side of a second surface of the second electrode, in which a resonator structure that resonates light emitted from the electroluminescence layer is configured of the second electrode and each of the reflective plates, the insulating layers have a plurality of openings, the openings are provided above the first surfaces of the first electrodes, the second electrode and the adsorption layer configure a laminated film, and in a case where regions corresponding to the openings in a plan view are defined as first regions, and regions corresponding to parts between the adjacent openings in the plan view are defined as second regions, a transmittance of the laminated film in the second regions is higher than a transmittance of the laminated film in the first regions.

A third disclosure is an electronic apparatus including the display device according to the first or second disclosure.

Each of FIGS. 5A, 5B, 5C, 5D, 5E, and 5F is a process diagram for explaining an example of a method for manufacturing the display device according to the first embodiment of the present disclosure.

Each of FIGS. 6A, 6B, 6C, and 6D is a process diagram for explaining an example of the method for manufacturing the display device according to the first embodiment of the present disclosure.

Figure 7:
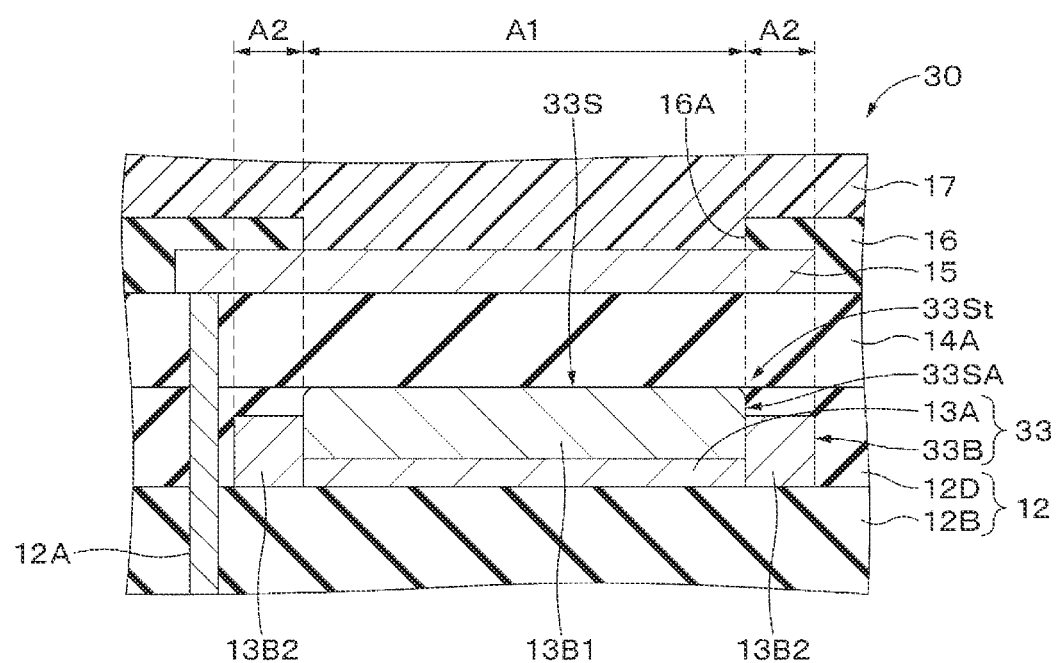

FIG. 7 is a sectional view illustrating an example of a configuration of a display device according to a second embodiment of the present disclosure.

Figure 8:
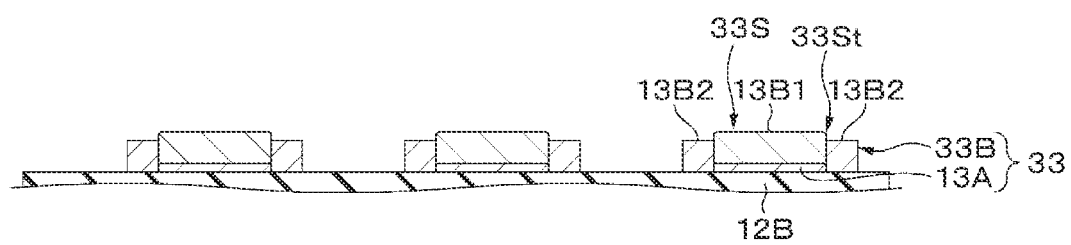

FIG. 8 is a process diagram for explaining an example of a method for manufacturing the display device according to the second embodiment of the present disclosure.

Figure 9:
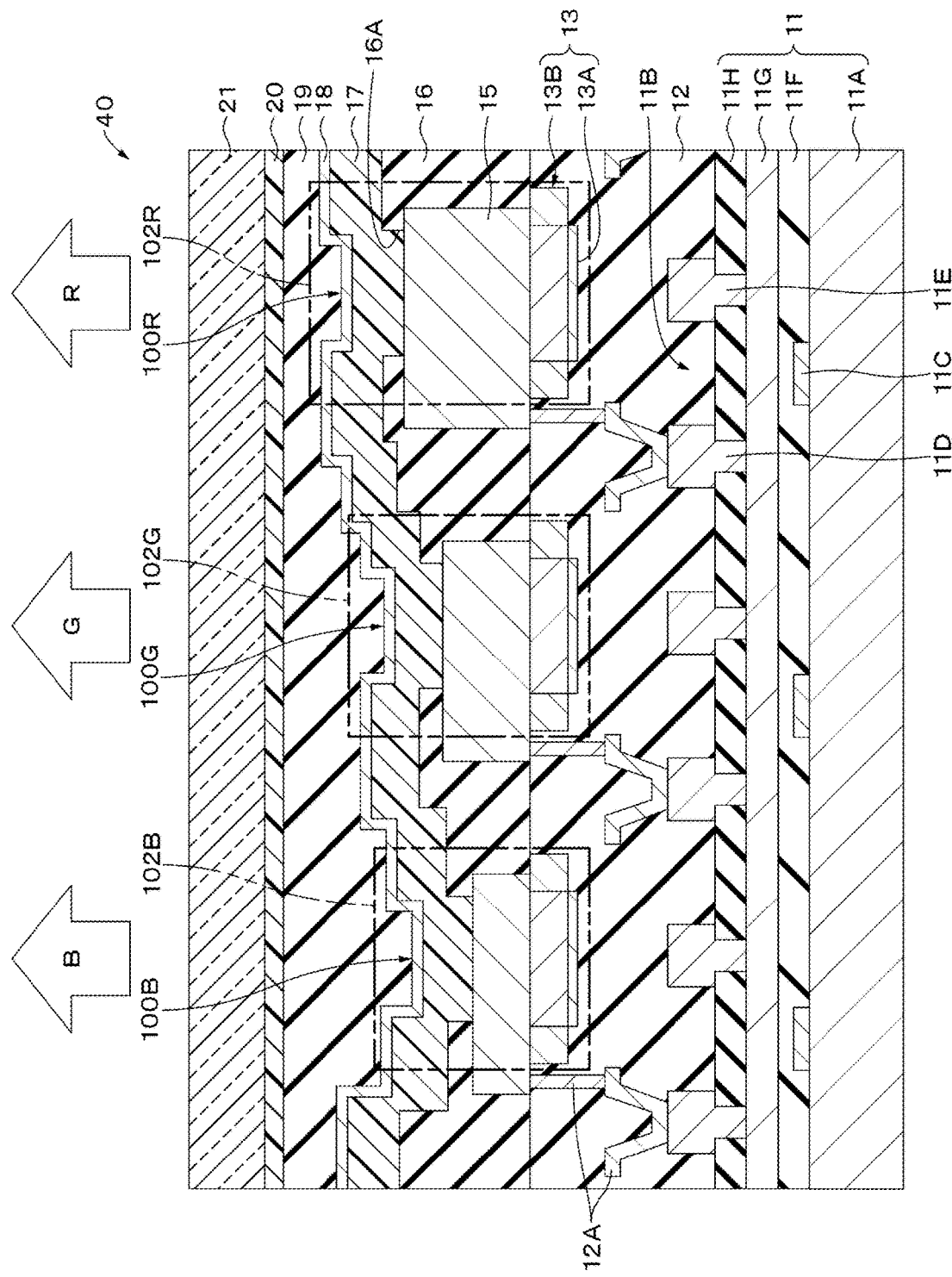

FIG. 9 is a sectional view illustrating an example of a configuration of a display device according to a third embodiment of the present disclosure.

Figure 10:
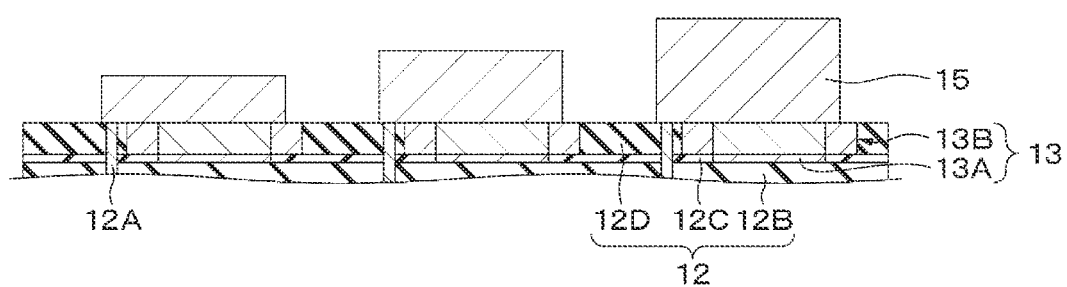

FIG. 10 is a process diagram for explaining an example of a method for manufacturing the display device according to the third embodiment of the present disclosure.

Figure 11:
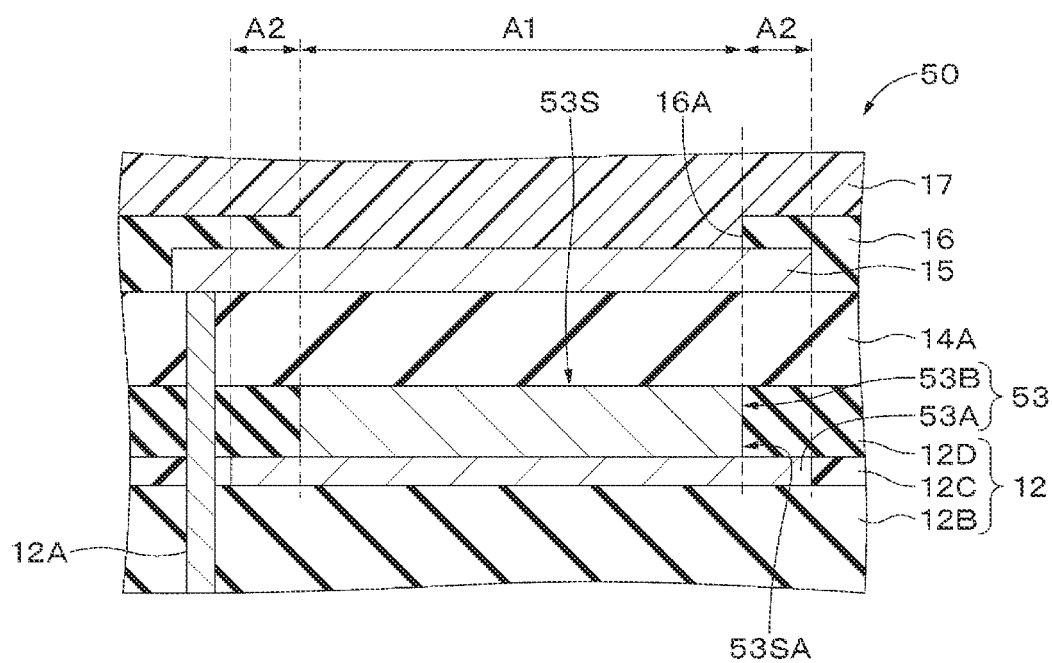

FIG. 11 is a sectional view illustrating an example of a configuration of a display device according to a fourth embodiment of the present disclosure.

Figure 12:
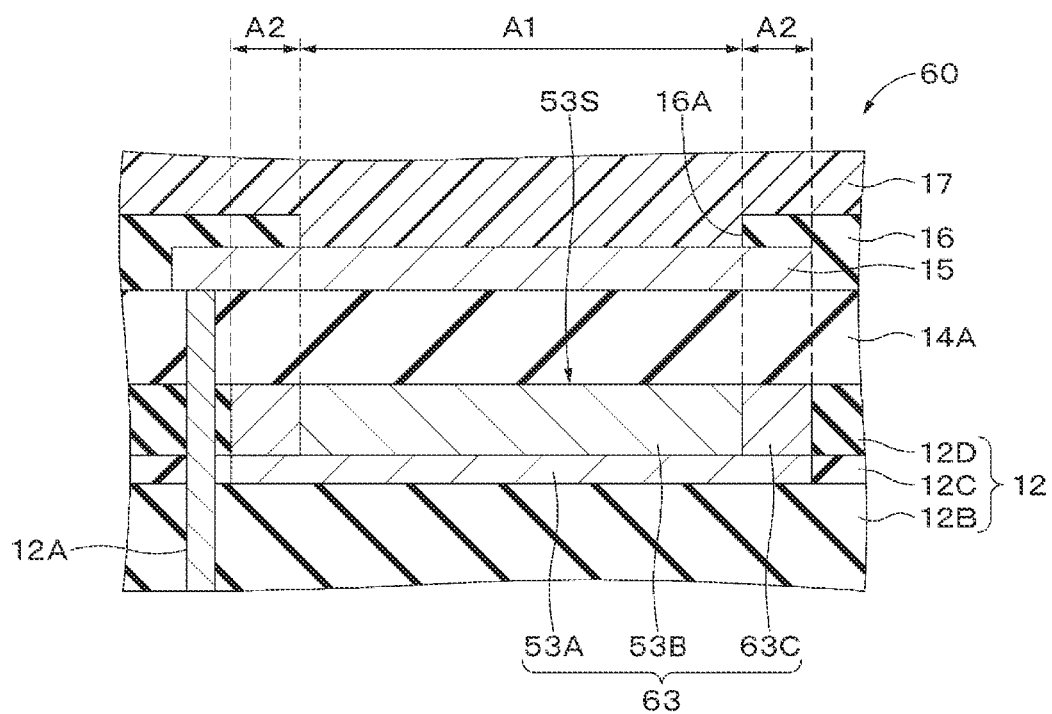

FIG. 12 is a sectional view illustrating an example of a display device according to a display device according to a fifth embodiment of the present disclosure.

Figure 13:
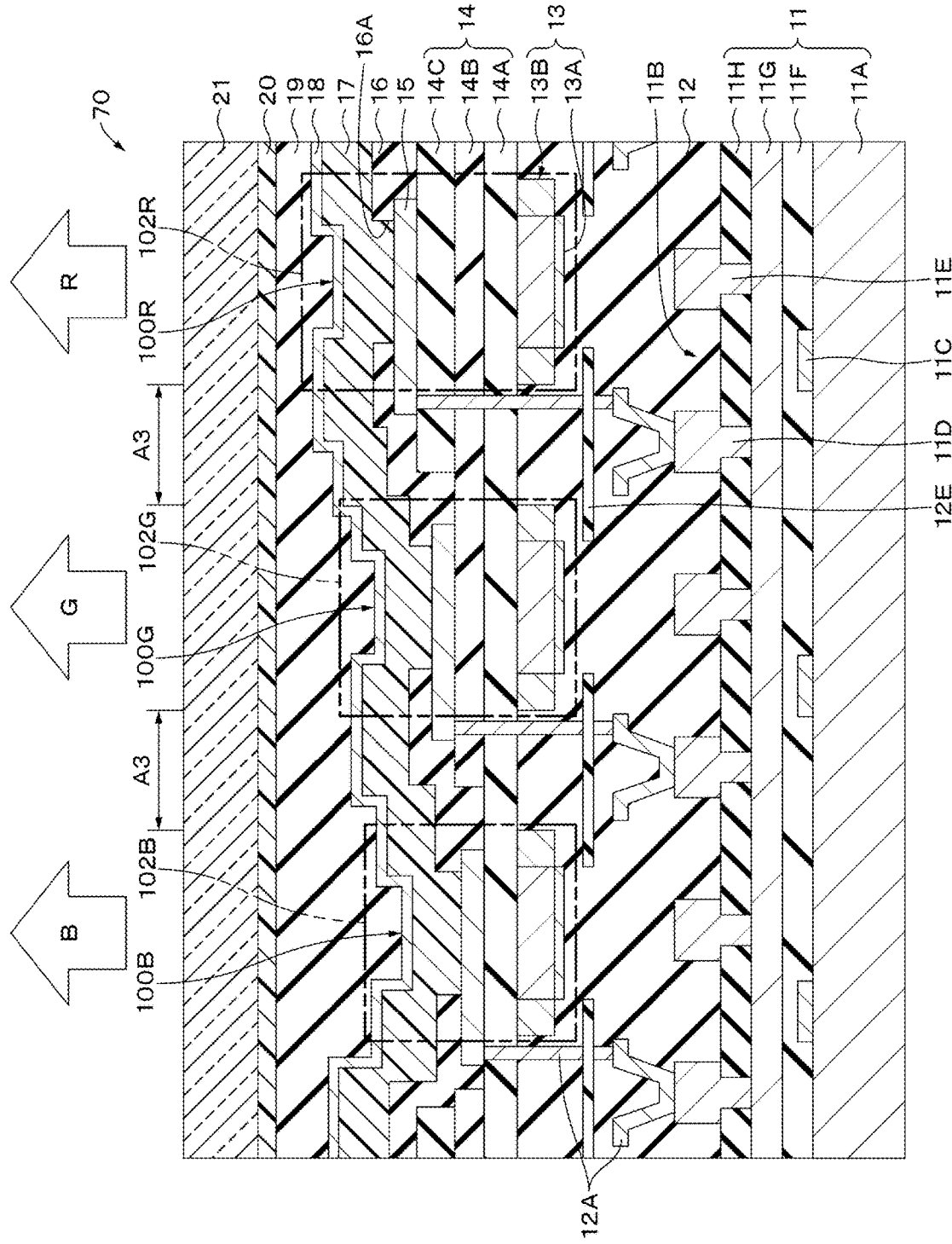

FIG. 13 is a sectional view illustrating an example of a configuration of a display device according to a sixth embodiment of the present disclosure.

Figure 14:
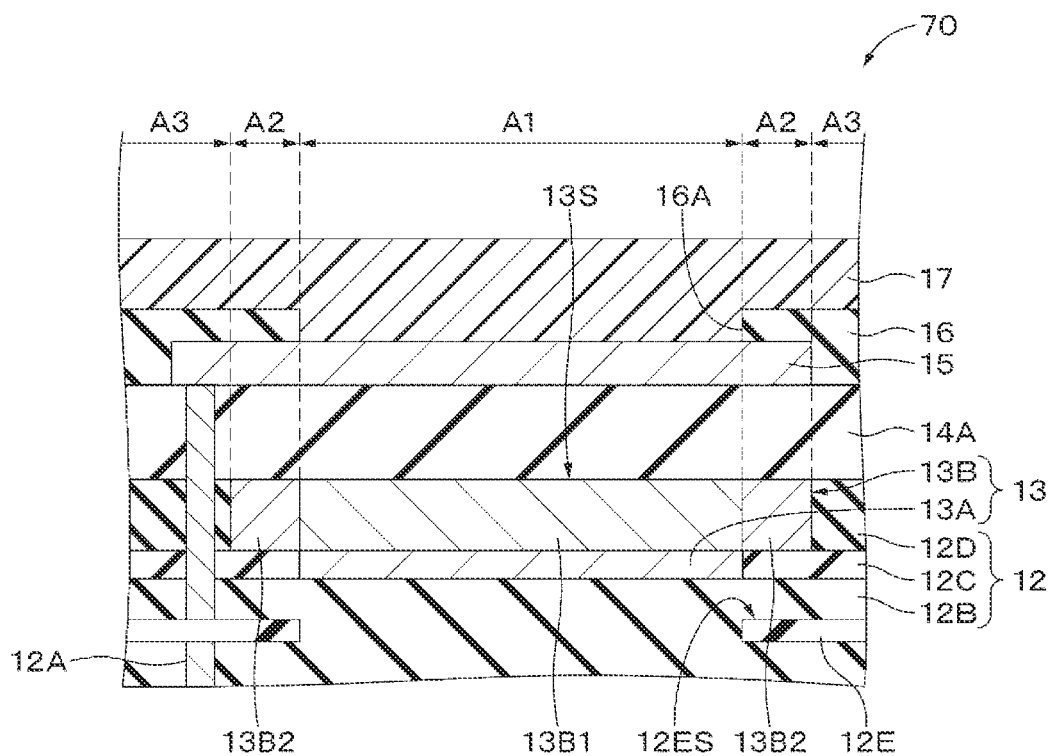

FIG. 14 is a sectional view showing a part of FIG. 13 in an enlarged manner.

Figure 15:
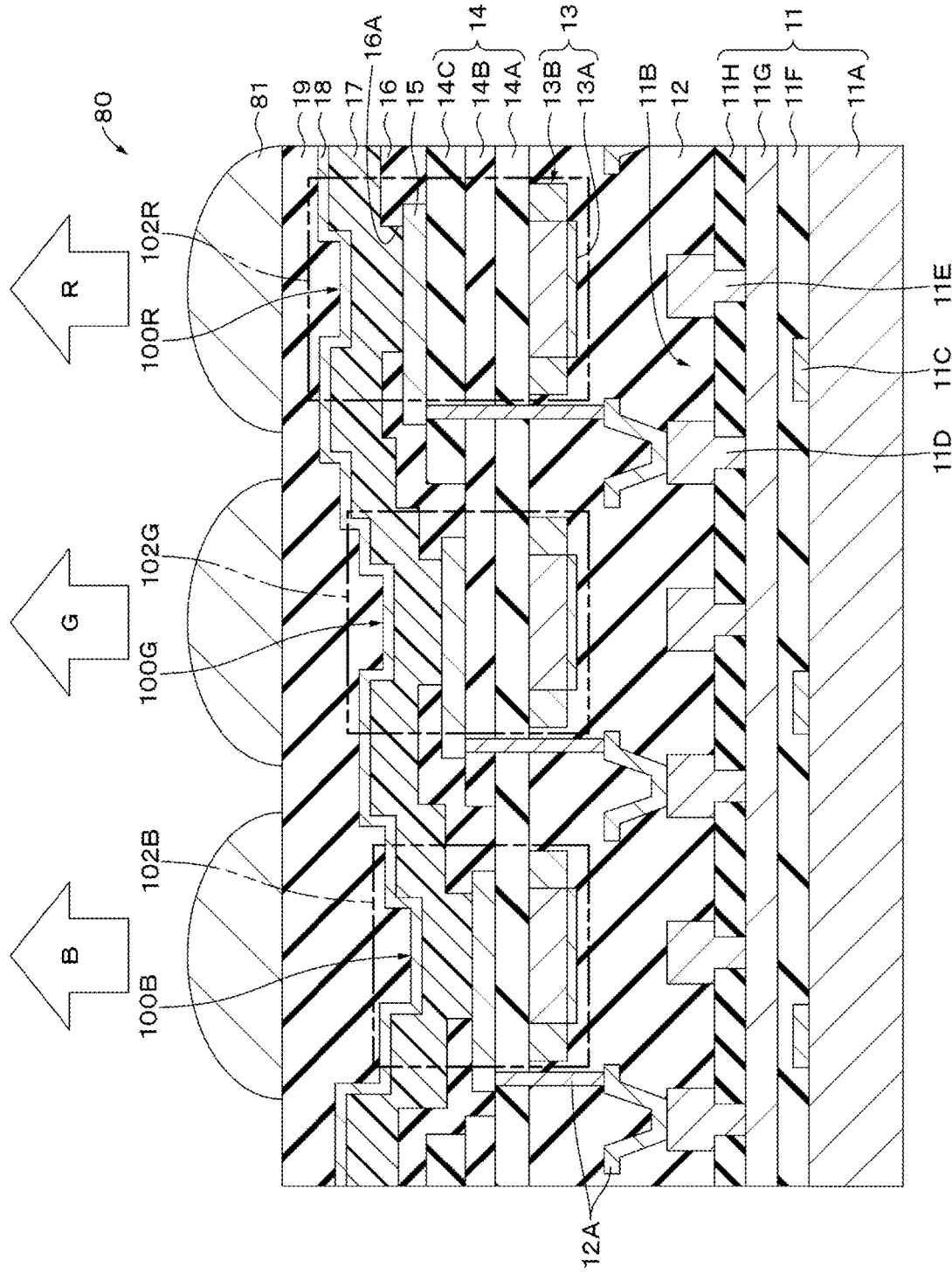

FIG. 15 is a sectional view illustrating an example of a configuration of a display device according to a seventh embodiment of the present disclosure.

Figure 16:
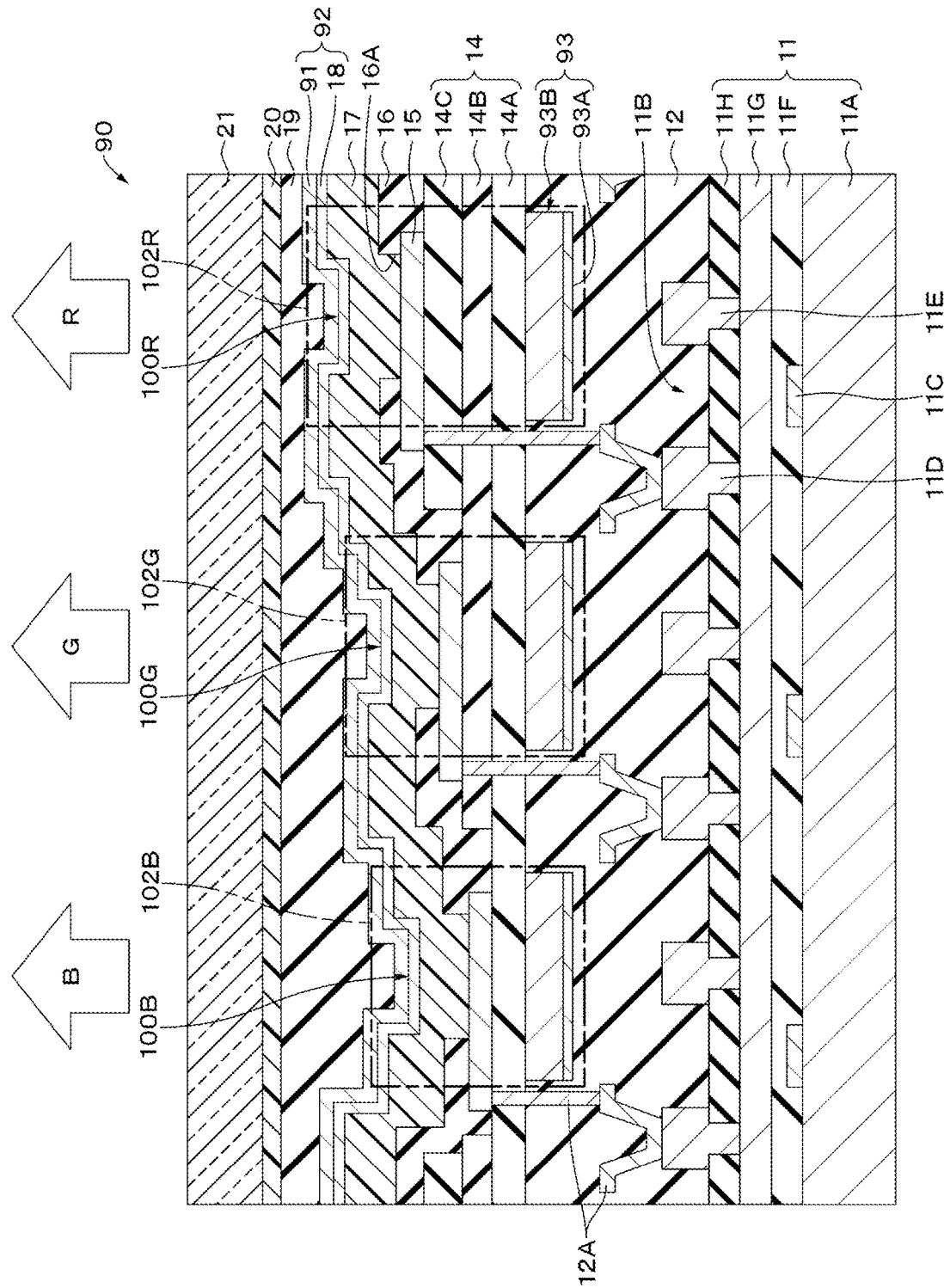

FIG. 16 is a sectional view illustrating an example of a configuration of a display device according to an eighth embodiment of the present disclosure.

Figure 17:
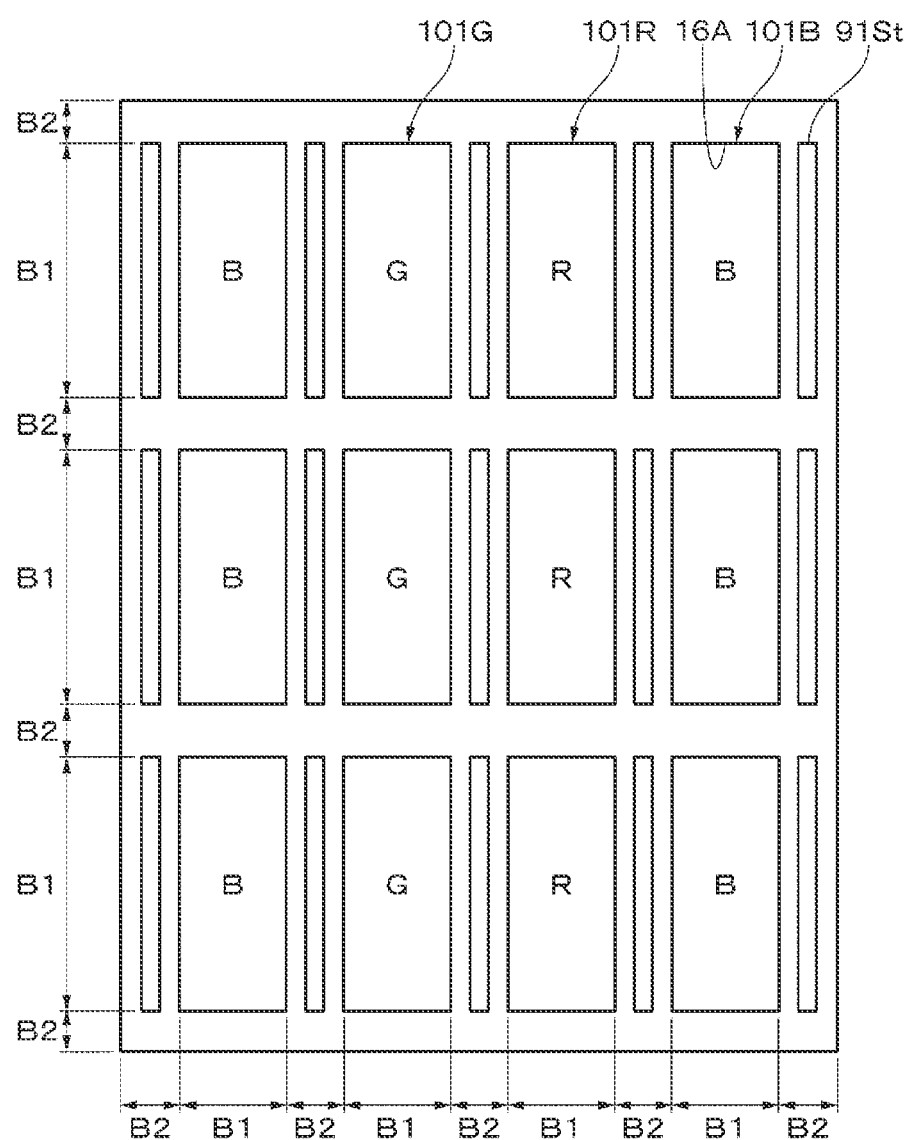

FIG. 17 is a plan view illustrating an example of a configuration of a sub-pixel.

Figure 18:
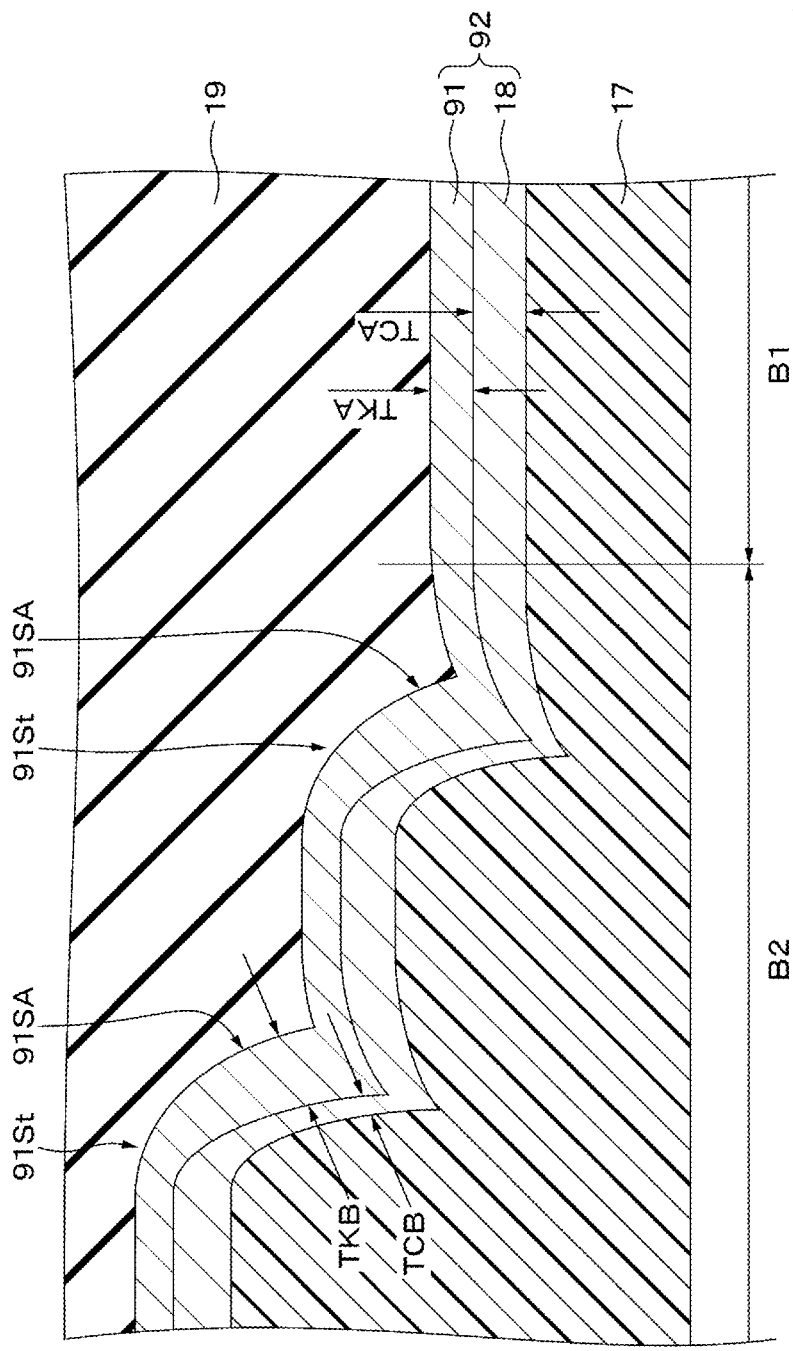

FIG. 18 is a sectional view showing a part of FIG. 16 in an enlarged manner.

FIGS. 19A, 19B, 19C, 19D, and 19E are process diagrams for explaining an example of a method for manufacturing the display device according to the eighth embodiment of the present disclosure.

Figure 20:
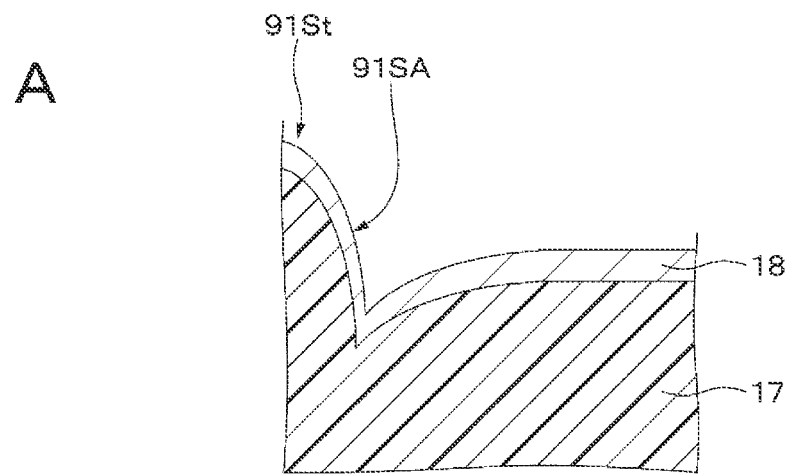
Figure 20:
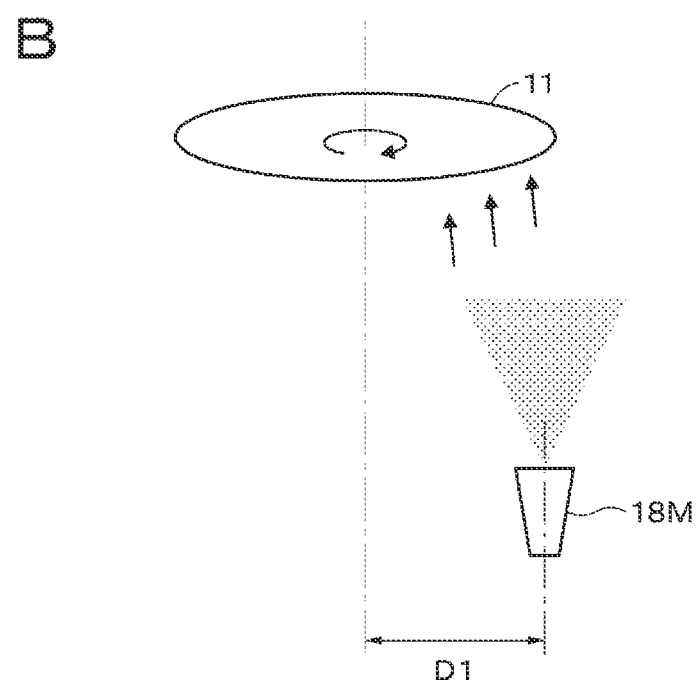

FIG. 20A is a sectional view for explaining a process for forming a second electrode. FIG. 20B is a schematic view for explaining the process for forming the second electrode.

Figure 21:
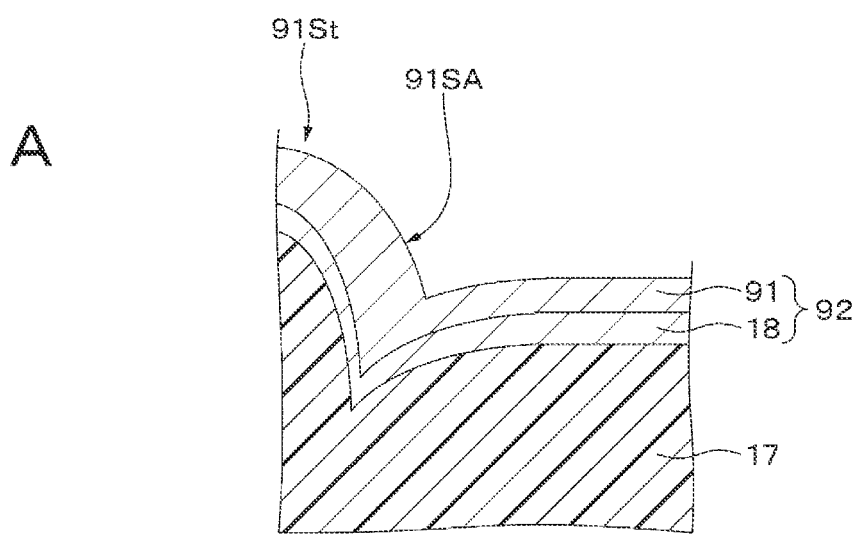
Figure 21:
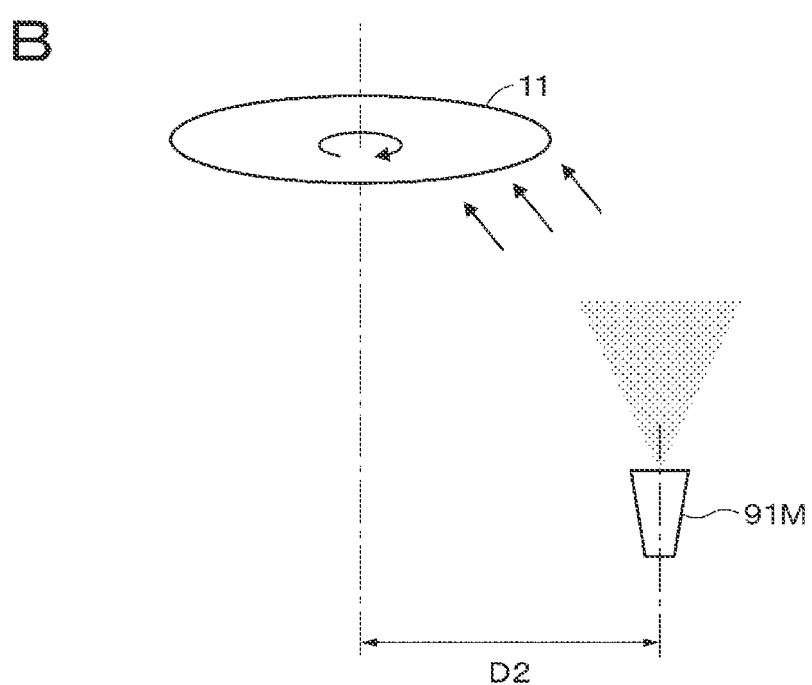

FIG. 21A is a sectional view for explaining a process for forming an adsorption layer. FIG. 21B is a schematic view for explaining the process for forming the adsorption layer.

Figure 22:
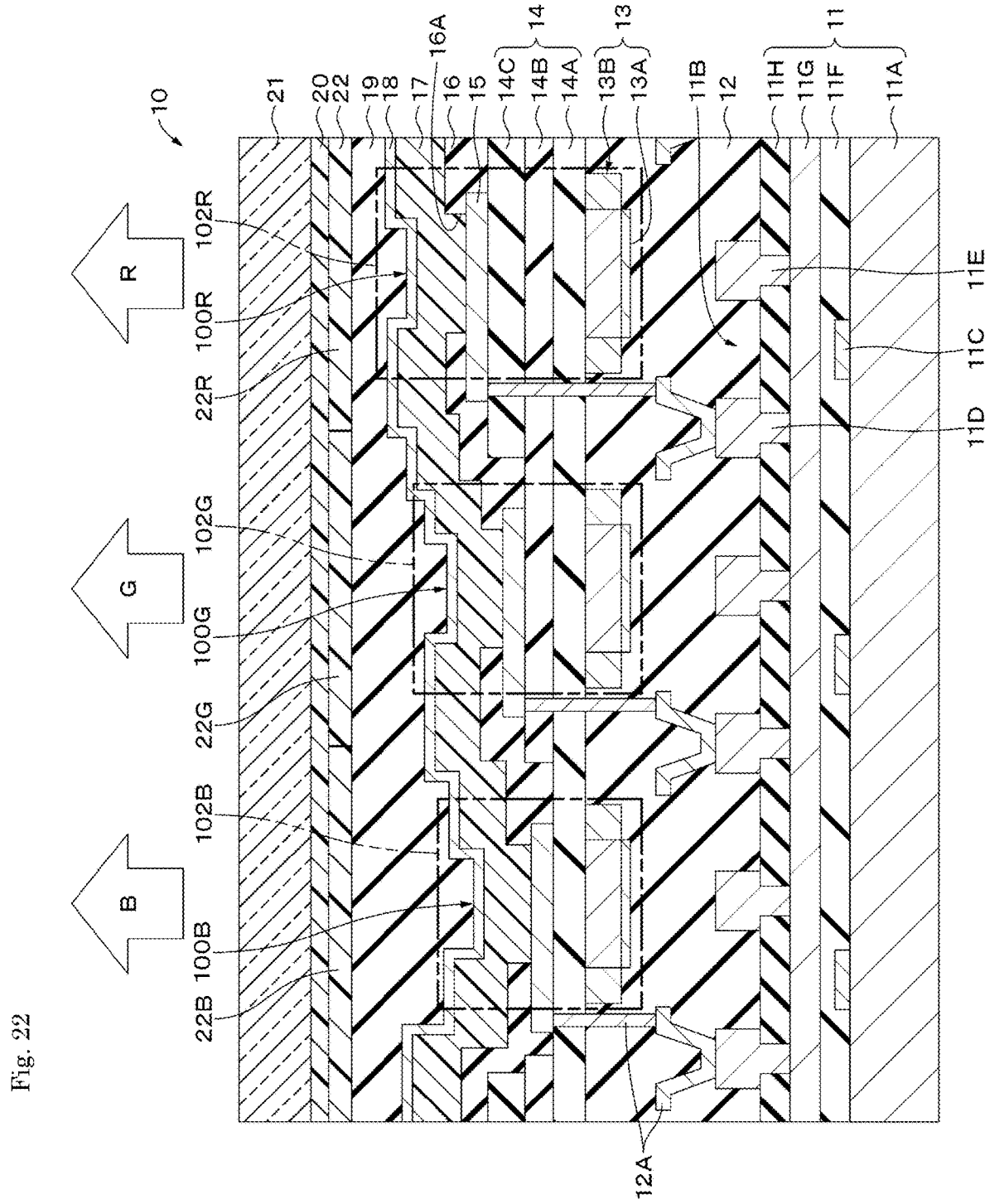

FIG. 22 is a sectional view illustrating an example of a configuration of a display device according to a modification example.

Figure 23:
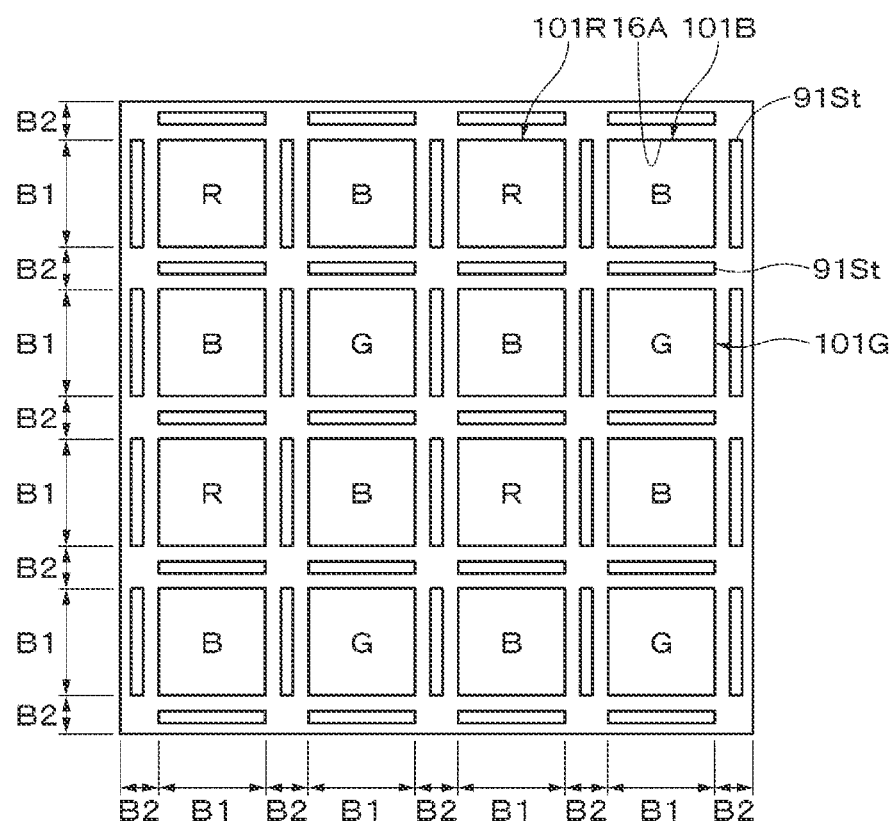

FIG. 23 is a plan view illustrating a modification example of the sub-pixel.

Figure 24:
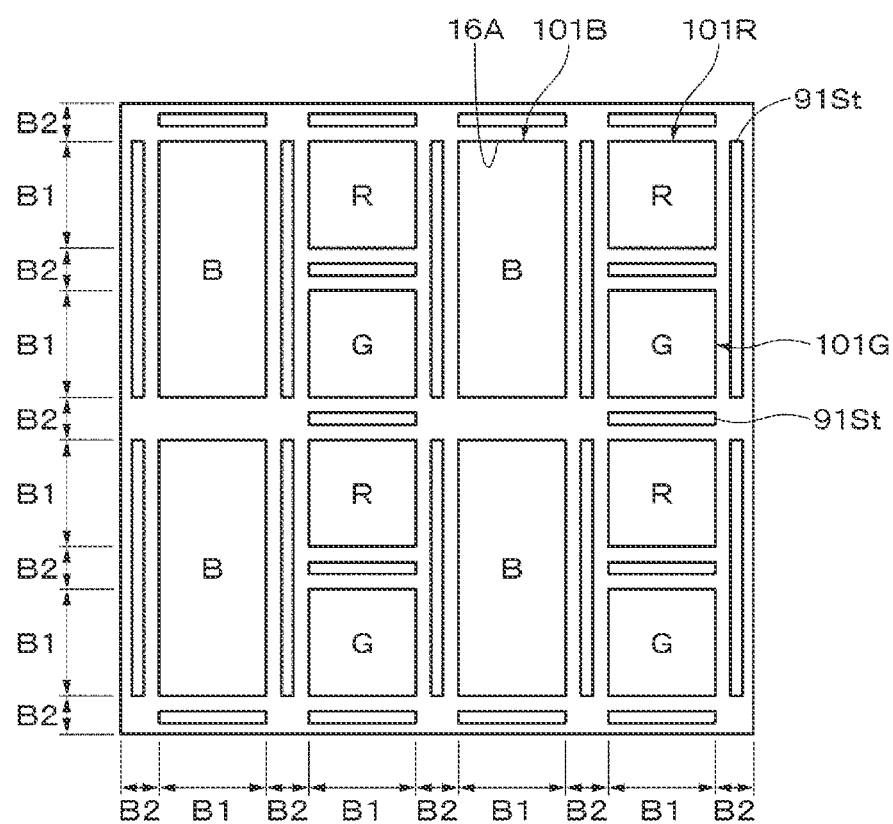

FIG. 24 is a plan view illustrating a modification example of the sub-pixel.

Figure 25:
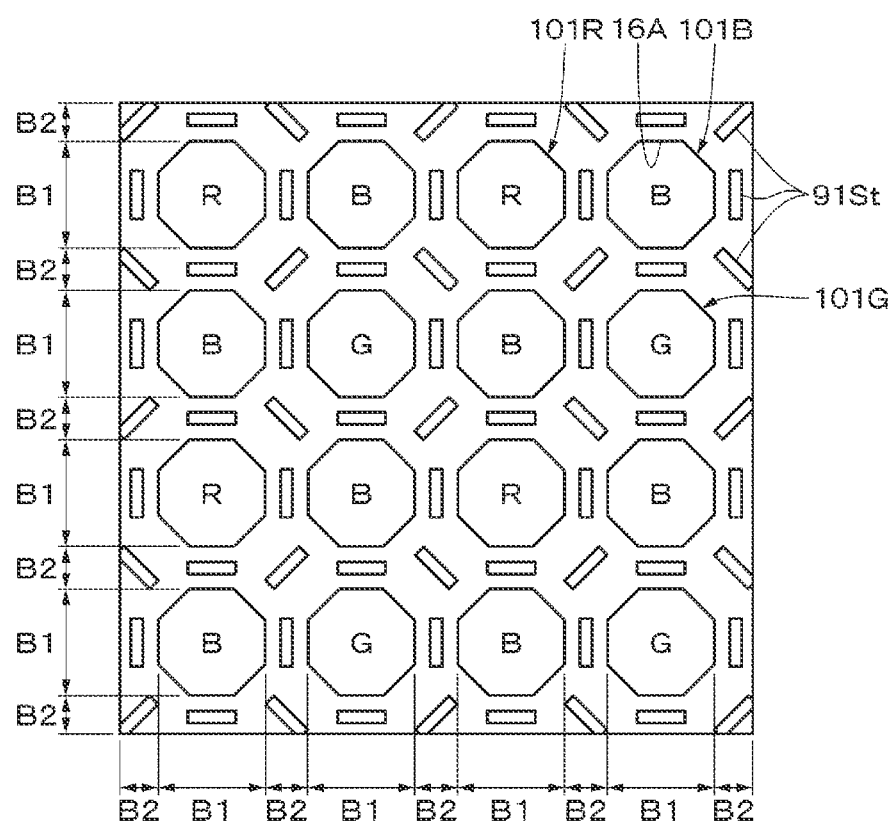

FIG. 25 is a plan view illustrating a modification example of the sub-pixel.

Figure 26:
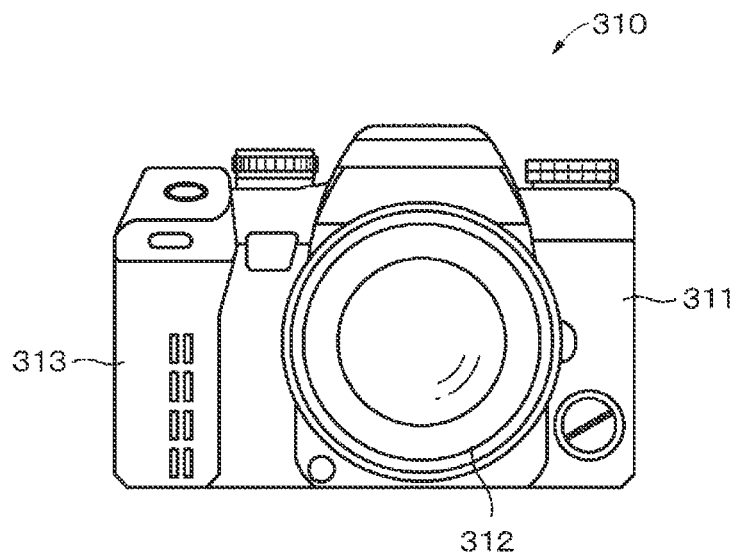
Figure 26:
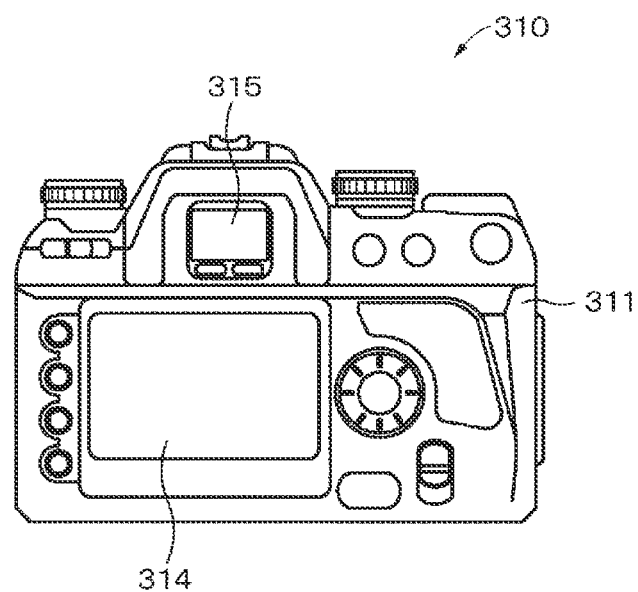

FIG. 26A is a front view showing an example of the appearance of a digital still camera. FIG. 26B is a rear view showing an example of the appearance of the digital still camera.

Figure 27:
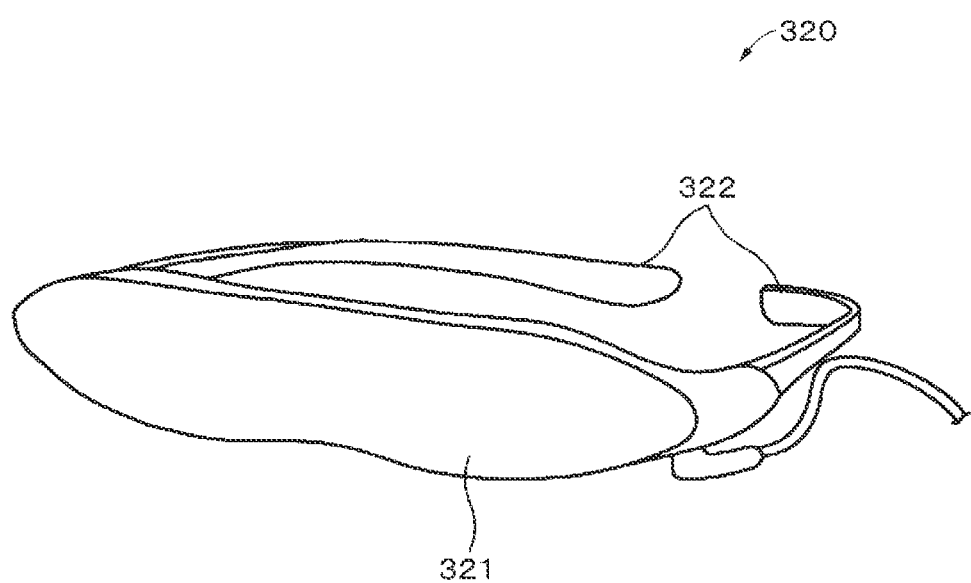

FIG. 27 is a perspective view of an example of the appearance of a head-mounted display.

Figure 28:
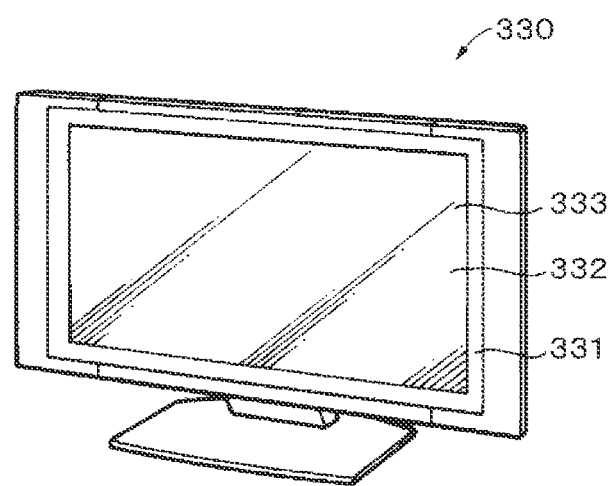

FIG. 28 is a perspective view showing an example of the appearance of a television device.

DESCRIPTION OF EMBODIMENTS

An embodiment of the present disclosure will be described in the following order. In addition, in all drawings of the following embodiments, the same or corresponding parts are denoted by the same reference numerals.

1. First embodiment (example of display device)
2. Second embodiment (example of display device)
3. Third embodiment (example of display device)
4. Fourth embodiment (example of display device)
5. Fifth embodiment (example of display device)
6. Sixth embodiment (example of display device)
7. Seventh embodiment (example of display device)
8. Eighth embodiment (example of display device)
9. Modification examples
10. Application examples (examples of electronic apparatus)

1 First Embodiment

[Overview]

In a display device that includes an organic EL layer provided commonly for all sub-pixels and has a resonator structure, a phenomenon in which carriers leak in a lateral direction of openings in inter-pixel insulating layer and the organic EL layer emits light even on the inter-pixel insulating layer is observed. The phenomenon significantly appears in a case where a low voltage is applied between electrodes, in particular.

Since the openings in the inter-pixel insulating layer are provided above first electrodes in the display device with the above configuration, steps caused by the openings in the inter-pixel insulating layer are generated between the sub-pixels in each of layers formed above the inter-pixel insulating layer. Also, since the thickness of an optical adjustment layer differs between a reflective layer and the first electrodes for the sub-pixels of each color in the display device with the above configuration, steps caused by the difference in thickness of the optical adjustment layer in each of the layers formed above the optical adjustment layer are generated between adjacent sub-pixels. Therefore, an interval between the reflective plate and a second electrode at peripheral edge parts of the openings in the inter-pixel insulating layer differs from the resonance length corresponding to the display color of the sub-pixels due to influences of the steps caused by the difference in thickness between the openings in the inter-pixel insulating layer and an optical path length adjustment layer in the display device with the above configuration.

As described above, since the organic EL layer emits light even on the inter-pixel insulating layer and the interval between the reflective plate and the second electrode at the peripheral edge parts of the openings in the inter-pixel insulating layer differs from the resonance length corresponding to the display color of the sub-pixels as described above, light with a color that is different from the color at the opening parts in the inter-pixel insulating layer is extracted at the peripheral edge parts of the openings in the inter-pixel insulating layers, and degradation of color purity occurs, in the display device with the above configuration. In other words, deterioration of chromaticity gradation occurs due to the steps and the leakage of carriers at the peripheral edge parts of the openings in the inter-pixel insulating layer.

In the first embodiment, a display device capable of curbing the above degradation of color purity by causing the reflective plate to have a different reflectance in accordance with regions will be described.

[Configuration of Display Device]

Figure 1:
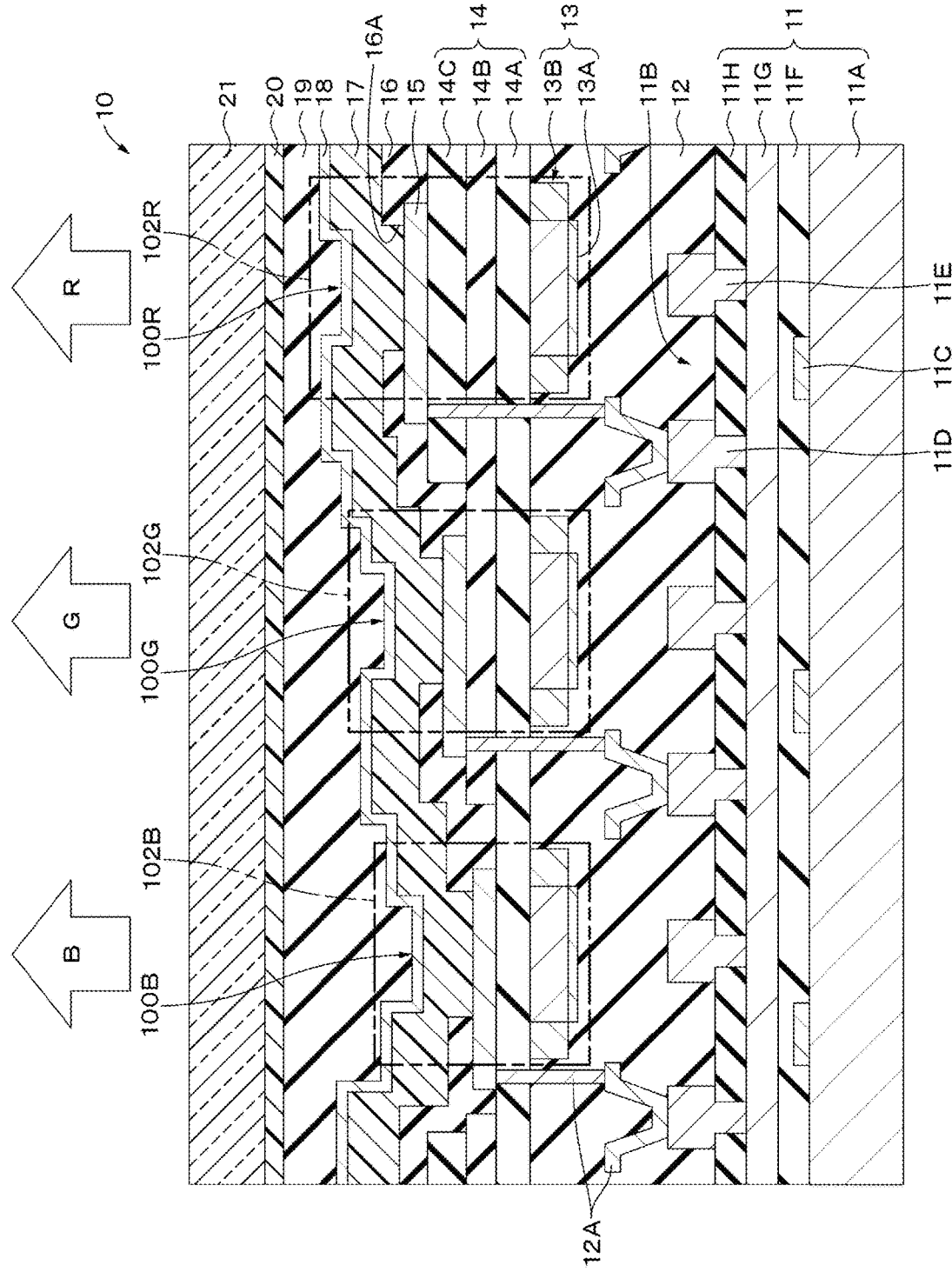
FIG. 1 is a sectional view illustrating an example of a configuration of a display device according to a first embodiment of the present disclosure.
Figure 2:
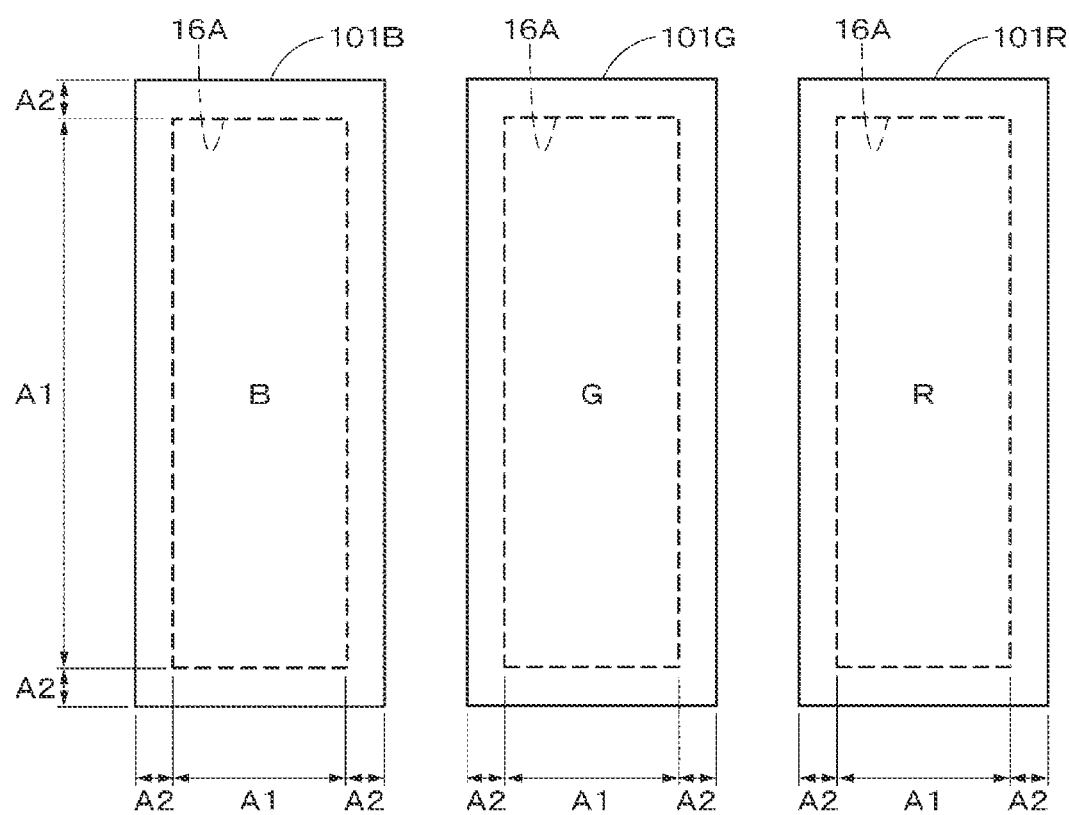
FIG. 2 is a plan view illustrating an example of a configuration of a sub-pixel.
Figure 3:
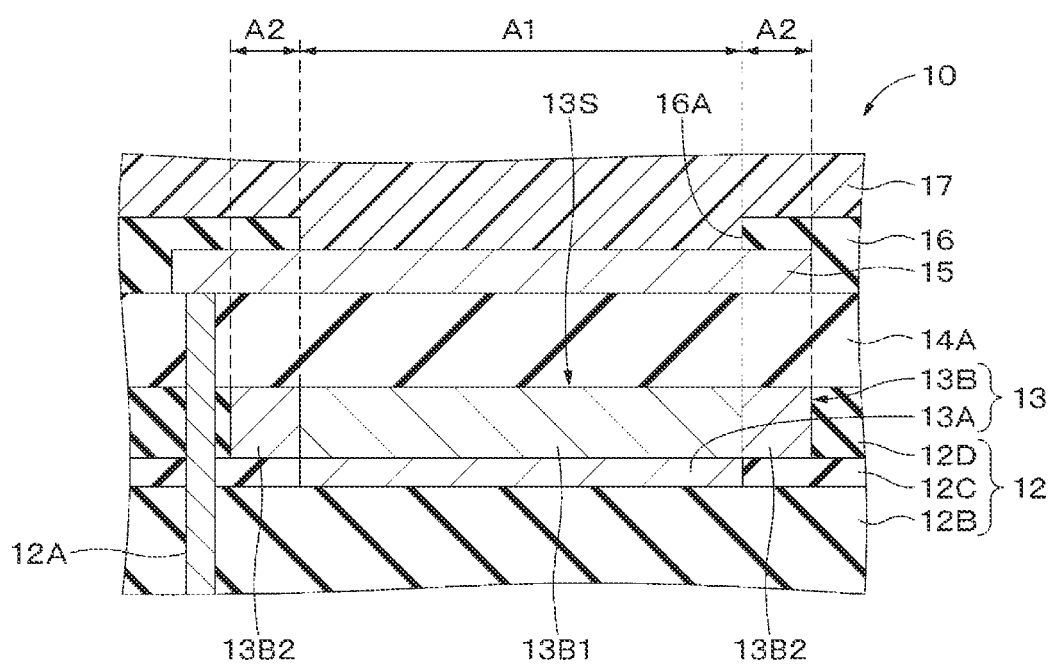
FIG. 3 is a sectional view showing a part of FIG. 1 in an enlarged manner.

FIG. 1 is a sectional view illustrating an example of a configuration of a display device 10 according to the first embodiment of the present disclosure. FIG. 2 is a plan view illustrating an example of a configuration of sub-pixels 101R, 101G, and 101B. FIG. 3 is a sectional view showing a part of FIG. 1 in an enlarged manner. The display device 10 includes a drive substrate 11, an insulating layer 12, a plurality of reflective plates 13, an optical path length adjustment layer 14, a plurality of first electrodes 15, an organic EL layer 17, a second electrode 18, a protective layer 19, a filling resin layer 20, and a counter substrate 21 in this order as illustrated in FIG. 1.

The display device 10 is a display device of a top emission scheme (upper surface emitting scheme). The side of the counter substrate 21 corresponds to the top side (display surface side) while the side of the drive substrate 11 corresponds to the bottom side. In the following description, a surface of the display device 10 on the top side will be referred to as a first surface, and the surface of the display device 10 on the bottom side will be referred to as a second surface in each layer configuring the display device 10.

(Organic EL Element)

The reflective plates 13, the optical path length adjustment layer 14, the first electrodes 15, the organic EL layer 17, and the second electrode 18 configure organic EL elements 100R, 100G, and 100B. The organic EL elements 100R, 100G, and 100B emit red light, green light, and blue light, respectively.

The organic EL elements 100R, 100G, and 100B configure sub-pixels 101R, 101G, and 101B of three colors illustrated in FIG. 2, respectively. The sub-pixel 101R is a red sub-pixel that displays a red color. The sub-pixel 101G is a green sub-pixel that displays a green color. The sub-pixel 101B is a blue sub-pixel that displays a blue color. The combination of the sub-pixels 101R, 101G, and 101B of the three colors configure one pixel.

In the following description, the organic EL elements 100R, 100G, and 100B will be referred to as organic EL elements 100 in a case where they are collectively referred to without being particularly distinguished from each other. Also, the sub-pixels 101R, 101G, and 101B will be referred to as sub-pixels 101 in a case where they are collectively referred to without being particularly distinguished from each other. The plurality of organic EL elements 100, that is, the plurality of sub-pixels 101 are two-dimensionally arranged in a prescribed arrangement pattern, such as a matrix shape, on the first surface of the drive substrate 11.

(Resonator Structure)

The organic EL elements 100R, 100G, and 100B are provided with resonator structures 102R, 102G, and 102B, respectively. The plurality of reflective plates 13 and the second electrode 18 configure the plurality of resonator structures 102R, 102G, and 102B. The resonator structures 102R, 102G, and 102B may be microcavity structures. The resonator structures 102R, 102G, and 102B resonate, emphasize, and emit light with predefined wavelengths. Specifically, the resonator structure 102R resonates and emphasizes red light included in white light generated by the organic EL layer 17 and outputs the light to the outside. The resonator structure 102G resonates and emphasizes green light included in the white light generated by the organic EL layer 17 and outputs the light to the outside. The resonator structure 102B resonates and emphasizes blue light included in the white light generated by the organic EL layer 17 and outputs the light to the outside.

An optical path length (optical distance) between the reflective plates 13 and the second electrode 18 is set in accordance with light with the prescribed wavelength to be resonated. More specifically, the optical path length between the reflective plates 13 and the second electrode 18 is set such that red light is resonated in the resonator structure 102R. The optical path length between the reflective plates 13 and the second electrode 18 is set such that green light is resonated in the resonator structure 102G. The optical path length between the reflective plates 13 and the second electrode 18 is set such that blue light is resonated in the resonator structure 102B.

(Drive Substrate)

The drive substrate 11 is a so-called backplane and drives the plurality of organic EL elements 100. The drive substrate 11 includes a substrate 11A, a plurality of gate electrodes 11C, a plurality of drain electrodes 11D, a plurality of source electrodes 11E, a gate insulating layer 11F, a semiconductor layer 11G, and an interlayer insulating layer 11H. The gate electrodes 11C, the drain electrodes 11D, the source electrodes 11E, the gate insulating layer 11F, the semiconductor layer 11G, and the interlayer insulating layer 11H configure thin-film transistors 11B of a bottom gate type.

A drive circuit including the plurality of thin-film transistors 11B is provided on the first surface of the substrate 11A. The drive circuit controls light emission of the plurality of organic EL elements 100. The substrate 11A may be made of, for example, glass or resin having low moisture and oxygen permeability or may be made of a semiconductor that facilitates the formation of transistors and the like. Specifically, the substrate 11A may be a glass substrate, a semiconductor substrate, a resin substrate, or the like. The glass substrate includes, for example, high strain-point glass, soda glass, borosilicate glass, forsterite, lead glass, or quartz glass. The semiconductor substrate includes, for example, amorphous silicon, polycrystalline silicon, monocrystalline silicon, or the like. The resin substrate includes, for example, at least one kind selected from the group consisting of polymethyl methacrylate, polyvinyl alcohol, polyvinyl phenol, polyethersulfone, polyimide, polycarbonate, polyethylene terephthalate, and polyethylene naphthalate. The substrate 11A may be a rigid substrate or may be a flexible substrate.

The gate electrodes 11C are provided on the first surface of the substrate 11A. The gate electrodes 11C include metal such as aluminum (Al), polysilicon, or the like. The gate electrodes 11C are connected to a scanning circuit (not illustrated). The gate insulating layer 11F is provided on the first surface of the substrate 11A to cover the gate electrodes 11C. The gate insulating layer 11F contains, for example, silicon oxide ($SiO_x$), silicon nitride ($SiN_x$), or the like.

The semiconductor layer 11G is provided on the first surface of the gate insulating layer 11F. The semiconductor layer 11G contains amorphous silicon, polycrystalline silicon, semiconductor oxide, or the like. A partial region of the semiconductor layer 11G is doped to a p type or an n type with impurities, and a drain region and a source region (both are not illustrated) are thereby formed. A channel region (not illustrated) is formed between the drain region and the source region and in a region of the semiconductor layer 11G above the gate electrodes 11C.

The interlayer insulating layer 11H is provided on the first surface of the semiconductor layer 11G. The interlayer insulating layer 11H contains at least one kind selected from a group consisting of silicon oxide ($SiO_x$), silicon nitride ($SiN_x$), silicon oxynitride (SiON), and the like. The interlayer insulating layer 11H is provided with a plurality of contact holes. The drain electrodes 11D are connected to a drain region of the semiconductor layer 11G via a contact hole provided in the interlayer insulating layer 11H. The source electrodes 11E are connected to a source region of the semiconductor layer 11G via a contact hole provided in the interlayer insulating layer 11H. The drain electrodes 11D and the source electrodes 11E contain metal such as aluminum (Al), for example.

(Insulating Layer)

The insulating layer 12 is provided on the drive circuit of the thin-film transistors 11B and formed on the substrate 11A and is flattened by covering the drive circuit. The insulating layer 12 may be a laminated body including a first insulating layer 12B, a second insulating layer 12C, and a third insulating layer 12D in this order as illustrated in FIG. 3. The insulating layer 12 may be an organic insulating layer, may be an inorganic insulating layer, or may be a laminated body thereof. The organic insulating layer contains at least one kind selected from a group consisting of a polyimide-based resin, an acrylic resin, a novolac-based resin, and the like, for example. The organic insulating layer contains at least one kind selected from a group consisting of silicon oxide ($SiO_x$), silicon nitride ($SiN_x$), silicon oxynitride (SiON), and the like, for example.

The insulating layer 12 includes a plurality of contact plugs 12A therein. The contact plugs 12A electrically connect the thin-film transistors 11B to the organic EL elements 100. The thin-film transistors 11B control light emission of the organic EL elements 100 via the contact plugs 12A. The contact plugs 12A contain at least one kind selected from a group consisting of copper (Cu), titanium (Ti), and the like, for example.

(First Electrode)

The plurality of first electrodes 15 are provided on the first surface of the optical path length adjustment layer 14. The plurality of first electrodes 15 are two-dimensionally arranged in a prescribed arrangement pattern such as a matrix shape on the first surface of the optical path length adjustment layer 14. The first electrodes 15 are anodes. Once a voltage is applied between the first electrode 15 and the second electrode 18, holes are input from the first electrodes 15 to the organic EL layer 17. The adjacent first electrodes 15 are electrically insulated from each other. The first electrodes 15 are connected to the contact plugs 12A included in the insulating layer 12.

The first electrodes 15 are preferably configured of a material having a high work function and a high transmittance from the viewpoint of enhancing light emission efficiency. The first electrodes 15 are preferably transparent electrodes. The transparent electrodes contain, for example, transparent conductive oxide (TCO). The transparent conductive oxide contains at least one kind selected from a group consisting of transparent conductive oxide containing indium (hereinafter, referred to as "indium-based transparent conductive oxide"), transparent conductive oxide containing tin (hereinafter, referred to as "tin-based transparent conductive oxide"), and transparent conductive oxide containing zinc (hereinafter, referred to as "zinc-based transparent conductive oxide"), for example.

The indium-based transparent conductive oxide contains, for example, indium tin oxide (ITO), indium zinc oxide (IZO), indium gallium oxide (IGO), indium gallium zinc oxide (IGZO), or fluorine-doped indium oxide (IFO). Among these kinds of transparent conductive oxide, indium tin oxide (ITO) is particularly preferably used. This is because indium tin oxide (ITO) has a particularly low hole injection barrier to the organic EL layer 17 in terms of the work function and the drive voltage of the display device 10 can thus be lowered to a low voltage. Examples of the tin-based transparent conductive oxide include tin oxide, antimony-doped tin oxide (ATO), or fluorine-doped tin oxide (FTO). Examples of the zinc-based transparent conductive oxide include zinc oxide, aluminum-doped zinc oxide (AZO), boron-doped zinc oxide, or gallium-doped zinc oxide (GZO). The thickness of the first electrodes 15 is preferably equal to or greater than 20 nm and equal to or less than 200 nm.

(Organic EL Layer)

The organic EL layer 17 is provided between the first electrodes 15 and the second electrode 18. The organic EL layer 17 is provided as an organic layer common for all the sub-pixels 101.

Figure 4:
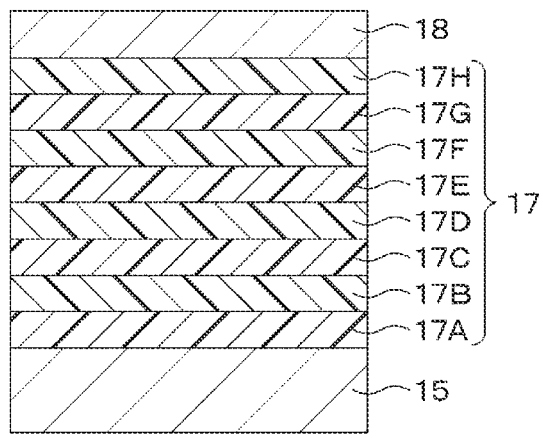
FIG. 4A is a sectional view illustrating an example of a configuration of an organic EL layer with a one-stack structure.
As illustrated in FIG. 4B, this is a sectional view illustrating an example of a configuration of an organic EL layer with a two-stack structure.
Figure 4:
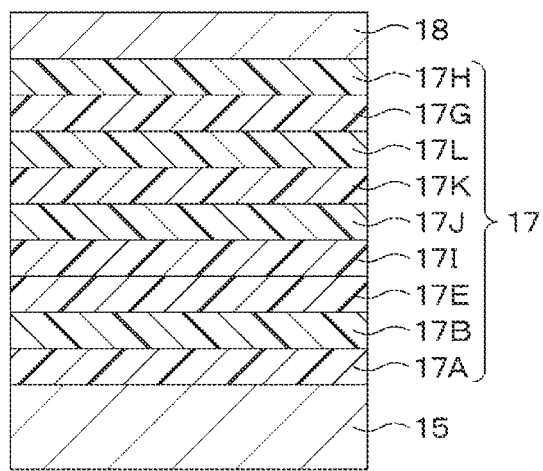

The organic EL layer 17 may be an organic EL layer with a one-stack structure as illustrated in FIG. 4A. In other words, the organic EL layer 17 may include a hole injection layer 17A, a hole transport layer 17B, a red light emission layer 17C, a light emission separation layer 17D, a blue light emission layer 17E, a green light emission layer 17F, an electron transport layer 17G, and an electron injection layer 17H in this order on the first surfaces of the first electrodes 15.

The hole injection layer 17A contains, for example, hexaazatriphenylene (HAT). The thickness of the hole injection layer 17A is preferably equal to or greater than 1 nm and equal to or less than 20 nm. The hole transport layer 17B contains, for example, α-NPD[N,N'-di(1-naphthyl)-N,N'-diphenyl-[1,1'-biphenyl]-4,4'-diamine]. The thickness of the hole transport layer 17B is preferably equal to or greater than 10 nm and equal to or less than 200 nm.

The red light emission layer 17C is adapted to generate red light by a part of holes injected from the first electrodes 15 via the hole injection layer 17A and the hole transport layer 17B and a part of electrons injected from the second electrode 18 via the electron injection layer 17H, the electron transport layer 17G, and the light emission separation layer 17D being recombined through application of an electric field.

The red light emission layer 17C contains, for example, a red light emission material. The red light emission material may have either a fluorescence or phosphorescence property. Specifically, the red light emission layer 17C is configured of a material obtained by mixing 30% by weight of 2,6-bis[(4'-methoxydiphenylamino)styryl]-1,5'-dicyanonaphthalene (BSN) to 4,4-bis(2,2-diphenylvinyne)biphenyl (DPVBi), for example. The thickness of the red light emission layer 17C is preferably equal to or greater than 5 nm and equal to or less than 50 nm.

The light emission separation layer 17D is a layer for adjusting injection of carriers into each of the light emission layers 17C, 17E, and 17F, and a light emission balance of each color is adjusted by the electrons and the holes being injected into each of the light emission layers 17C, 17E, and 17F via the light emission separation layer 17D. The light emission separation layer 17D contains, for example, 4,4'-bis[N-(1-naphthyl)-N-phenyl-amino]biphenyl derivative or the like.

The blue light emission layer 17E is adapted to generate blue light by a part of holes injected from the first electrodes 15 via the hole injection layer 17A, the hole transport layer 17B, and the light emission separation layer 17D and a part of electrons injected from the second electrode 18 via the electron injection layer 17H and the electron transport layer 17G being recombined through application of an electric field. The blue light emission layer 17E contains, for example, a blue light emission material. The blue light emission material may have either a fluorescence or phosphorescence property. The blue light emission layer 17E is configured of a material obtained by mixing 2.5% by weight of 4,4'-bis[2-{4-(N,N-diphenylamino)phenyl}vinyl]biphenyl (DPAVBi) to DPVBi, for example. The thickness of the blue light emission layer 17E may be equal to or greater than 5 nm and equal to or less than 50 nm.

The green light emission layer 17F is adapted to generate green light by a part of holes injected from the first electrodes 15 via the hole injection layer 17A, the hole transport layer 17B, and the light emission separation layer 17D and a part of electrons injected from the second electrode 18 via the electron injection layer 17H and the electron transport layer 17G being recombined through application of an electric field. The green light emission layer 17F contains, for example, a green light emission material. The green light emission material may have either a fluorescence or phosphorescence property. Specifically, the green light emission layer 17F is configured of a material obtained by mixing 5% by weight of coumarin 6 to DPVBi, for example. The thickness of the green light emission layer 17F is preferably equal to or greater than 5 nm and equal to or less than 50 nm.

The electron transport layer 17G contains at least one kind selected from a group consisting of BCP (2,9-dimethyl-4,7-diphenyl-1,10-phenanthroline), Alq3 (alumiquinolinol), and Bphen (bathophenanthroline), and the like, for example. The electron transport layer 17G includes at least one or more layers and may contain an electron transport material doped with alkali metal or alkali earth metal.

The electron transport material doped with alkali metal or alkali earth metal may be obtained by doping BCP (2,9-dimethyl-4,7-diphenyl-1,10-phenanthroline), Alq3 (alumiquinolinol), Bphen (bathophenanthroline), or the like as a host material with alkali metal such as lithium (Li), sodium (Na), potassium (K), rubidium (Rb), or cesium (Cs) or alkali earth metal such as magnesium (Mg), calcium (Ca), strontium (Sr), or barium (Ba) within a range of equal to or greater than 0.5% by weight and equal to or less than 15% by weight, for example, through co-evaporation. The thickness of the electron transport layer 17G is preferably equal to or greater than 10 nm and equal to or less than 200 nm.

The electron injection layer 17H is for promoting electron injection from the cathodes and contains alkali metal or alkali earth metal alone or a compound containing them, such as lithium (Li) or lithium fluoride (LiF).

The thicknesses of the organic EL layer 17 and each layer configuring it are set such that the optical film thicknesses thereof enable operations in accordance with wavelengths of the sub-pixels 101 of each color.

The organic EL layer 17 may be an organic EL layer with a two-stack structure as illustrated in FIG. 4B. In other words, the organic EL layer 17 may include a hole injection layer 17A, a hole transport layer 17B, a blue light emission layer 17E, an electron transport layer 17I, a charge generation layer 17J, a hole transport layer 17K, a yellow light emission layer 17L, an electron transport layer 17G, and an electron injection layer 17H in this order.

(Second Electrode)

The second electrode 18 is provided to face the plurality of first electrodes 15. The second electrode 18 is provided as an electron common for all the sub-pixels 101. The second electrode 18 is a cathode. The second electrode 18 is a transparent electrode that exhibits permeability with respect to light generated by the organic EL layer 17. Here, the transparent electrode includes a semi-permeable reflective layer. The second electrode 18 is preferably configured of a material with a low work function from the viewpoint of enhancing light emission efficiency. The thickness of the second electrode 18 is preferably equal to or greater than 3 nm and equal to or less than 15 nm.

The second electrode 18 is configured of at least one layer out of a metal layer and a metal oxide layer, for example. More specifically, the second electrode 18 is configured of a single-layer film of a metal layer or a metal oxide layer or a laminated film of a metal layer and a metal oxide layer. In a case where the second electrode 18 is configured of a laminated film, or the metal layer may be provided on the side of the organic EL layer 17, the metal oxide layer may be provided on the side of the organic EL layer 17, but the metal layer is preferably provided on the side of the organic EL layer 17 from the viewpoint of causing the layer with a low work function to be adjacent to the organic EL layer 17.

The metal layer contains at least one kind of metal element selected from a group consisting of magnesium (Mg), aluminum (Al), silver (Ag), calcium (Ca), and sodium (Na), for example. The metal layer may contain, as a constituent element of an alloy, above at least one kind of metal element. Specific examples of the alloy include an MgAg alloy, an MgAl alloy, and an AlLi alloy. The metal oxide contains at least one kind of a mixture of indium oxide and tin oxide (ITO), a mixture of indium oxide and zinc oxide (IZO), and zinc oxide (ZnO), for example.

The second electrode 18 may be a multi-layer film in which a first metal layer and a second metal layer are laminated. The first metal layer out of the first metal layer and the second metal layer may be provided on the side of the organic EL layer 17. The first metal layer contains at least one kind selected from a group consisting of calcium (Ca), barium (Ba), lithium (Li), cesium (Cs), indium (In), magnesium (Mg), and silver (Ag), for example. The first metal layer may contain above at least one kind of metal element as a constituent element of an alloy. The second metal layer contains at least one kind selected from a group consisting of magnesium (Mg) and silver (Ag), for example. The second metal layer may contain above at least one kind of metal element as a constituent element of an alloy.

(Inter-Pixel Insulating Layer)

The inter-pixel insulating layer 16 is provided on the first surface of the optical path length adjustment layer 14 and between the adjacent first electrodes 15. The inter-pixel insulating layer 16 electrically insulates the adjacent first electrodes 15. The inter-pixel insulating layer 16 includes a plurality of openings 16A. Each of the plurality of openings 16A is provided to correspond to each sub-pixel 101. The opening 16A is provided above the first surfaces (the counter surfaces of the second electrode 18) of the first electrodes 15. The first electrodes 15 and the organic EL layer 17 come into contact with each other via the openings 16A.

In the first embodiment, regions corresponding to the openings 16A in a plan view will be referred to as first regions A1, and regions corresponding to peripheral edge parts of the openings 16A in a plan view will be referred to as second regions A2. The peripheral edge parts of the openings 16A preferably include regions from the peripheral edges of the openings 16A to the peripheral edges of the reflective plates 33 in a plan view. In the specification, the plan view means that an object is seen in a direction that is perpendicular to the display surface. The inter-pixel insulating layer 16 covers a part from the peripheral edge parts of the first surfaces of the first electrodes 15 to the side surfaces (end surfaces) of the first electrodes 15. In this specification, the peripheral edge part of the first surface refers to a region having a predetermined width toward the inner side from the peripheral edge of the first surface.

As a constituent material of the inter-pixel insulating layer 16, materials similar to those for the insulating layer 12 described above can be exemplified.

(Reflective Plates)

The reflective plate 13 is provided for each sub-pixel 101. Each reflective plate 13 faces the second surface of the first electrode 15. The reflective plates 13 have counter surfaces (first surfaces) 13S that face the organic EL layer 17 via the first electrodes 15. The reflective plates 13 are provided in the insulating layer 12 such that the counter surfaces 13S of the reflective plates 13 are exposed from the insulating layer 12. The counter surfaces 13S reflect light output from the organic EL layer 17.

The reflective plates 13 are provided in the first regions A1 and the second regions A2. A reflectance R1 of the counter surfaces 13S in the first regions A1 and a reflectance R2 of the counter surfaces 13S in the second regions A2 satisfy a relationship of R2<R1. It is possible to reduce the amount of light extracted from the second regions A2 by the reflectance R1 and R2 satisfying the relationship of R2<R1.

Here, the reflectance R1 and R2 is assumed to mean average reflectance of wavelength bands of visible light. The wavelength bands of visible light are wavelength bands of equal to or greater than 360 nm and equal to or less than 830 nm. Also, in a case where the reflectance R1 changes depending on the positions in the first regions A1, the reflectance R1 is assumed to mean a reflectance at a position where the reflectance R1 is maximum in the first regions A1. Similarly, in a case where the reflectance R2 changes depending on the positions in the second regions A2, the reflectance R2 is assumed to mean a reflectance at a position where the reflectance R2 is maximum in the second regions A2.

The reflective plates 13 include base layers 13A and reflective layers 13B in this order. The crystal orientation of the reflective layers 13B is improved by the base layer 13A when the reflective layers 13B are formed. The base layers 13A are provided in the first regions A1 and are not provided in the second regions A2. The base layers 13A contain at least one kind selected from a group consisting of titanium (Ti), titanium nitride (TiN), titanium oxide ($TiO_2$), and the like, for example. The thickness of the base layers 13A is preferably equal to or greater than 5 nm and equal to or less than 100 nm.

The reflective layers 13B are main bodies of the reflective plates 13 and include the counter surfaces 13S. The crystal structure of the reflective layers 13B is preferably similar to the crystal structure of the base layers 13A. This is because it is possible to grow the reflective layers 13B with a satisfactory crystal orientation on the first surfaces of the base layers 13A. The crystallinity of the reflective layers 13B preferably differs between the first regions A1 and the second regions A2. It is thus possible to cause the reflectance R1 of the counter surfaces 13S in the first regions A1 and the reflectance R2 of the counter surfaces 13S in the second regions A2 to be different from each other. In order to satisfy the relationship of R2<R1, the crystallinity of the reflective layers 13B in the second regions A2 is preferably lower than the crystallinity of the reflective layers 13B in the first regions A1.

The sizes of irregularities of the counter surfaces 13S differ between the first regions A1 and the second region A2. The sizes of the irregularities of the counter surfaces 13S in the first regions A1 are preferably larger than the sizes of the irregularities of the counter surfaces 13S in the second regions A2. It is thus possible to curb diffused reflection of light of the counter surfaces 13S of the reflective plates 13 in the first regions A1 and thereby to improve display quality. The sizes of the irregularities of the counter surfaces 13S can be evaluated by measuring arithmetic mean roughness Ra of the counter surfaces 13S, for example.

The reflective layers 13B are provided in the first regions A1 and the second regions A2. In a plan view, the peripheral edges of the reflective layers 13B are located outside the peripheral edges of the base layers 13A. Hereinafter, parts of the reflective layers 13B corresponding to the first regions A1 may be referred to as inner parts 13B1, and parts of the reflective layers 13B corresponding to the second regions A2 may be referred to as peripheral edge parts 13B2. The inner parts 13B1 of the reflective layers 13B are provided on the first surfaces of the base layers 13A. The peripheral edge parts 13B2 of the reflective layers 13B are provided outside the first surfaces of the base layers 13A.

The inner parts 13B1 of the reflective layers 13B and the peripheral edge parts 13B2 of the reflective layers 13B are located at the same height. It is thus possible to curb occurrence of steps at the boundaries between the first regions A1 and the second regions A2 of the counter surfaces 13S and thereby to curb diffused reflection of light due to the steps. It is thus possible to curb degradation of display quality.

The reflective layers 13B are configured of a material with a light reflecting property. Specifically, the reflective layers 13B contain at least one kind selected from a group consisting of silver (Ag), a silver alloy, aluminum (Al), an aluminum alloy, platinum (Pt), gold (Au), chromium (Cr), tungsten (W), and the like, for example. The thickness of the reflective layers 13B is preferably equal to or greater than 100 nm and equal to or less than 300 nm.

(Optical Adjustment Layer)

The optical path length adjustment layer 14 is provided on the first surface of the insulating layer 12 to cover the reflective plates 13. The optical path length adjustment layer 14 is a layer for adjusting the optical path lengths between the reflective plates 13 and the second electrode 18 for the organic EL elements 100R, 100G, and 100B of the three colors.

The thicknesses of the optical path length adjustment layer 14 differs for each of the organic EL elements 100R, 100G, and 100B of the three colors. Specifically, the thickness of the optical path length adjustment layer 14 of the red organic EL element 100R is selected such that red light is resonated and emphasized. The thickness of the optical path length adjustment layer 14 of the green organic EL element 100G is selected such that green light is resonated and emphasized. The thickness of the optical path length adjustment layer 14 of the blue organic EL element 100G is selected such that blue light is resonated and emphasized. The thicknesses of the optical path length adjustment layer 14 are preferably set within a range of equal to or greater than 5 nm and equal to or less than 300 nm.

The optical path length adjustment layer 14 may include a first optical path length adjustment layer 14A, a second optical path length adjustment layer 14B, and a third optical path length adjustment layer 14C in this order as illustrated in FIG. 3. The optical path length adjustment layer 14 of the blue organic EL element 100B is configured of the first optical path length adjustment layer 14A. In the blue organic EL element 100B, the optical path length between the reflective plates 13 and the second electrode 18 is adjusted through adjustment of the thickness of the first optical path length adjustment layer 14A.

The optical path length adjustment layer 14 of the green organic EL element 100G is configured of the first optical path length adjustment layer 14A and the second optical path length adjustment layer 14B. In the green organic EL element 100G, the optical path length between the reflective plates 13 and the second electrode 18 is adjusted through adjustment of the thickness of the second optical path length adjustment layer 14B.

The optical path length adjustment layer 14 of the red organic EL element 100R is configured of the first optical path length adjustment layer 14A, the second optical path length adjustment layer 14B, and the third optical path length adjustment layer 14C. In the red organic EL element 100R, the optical path length between the reflective plates 13 and the second electrode 18 is adjusted through adjustment of the thickness of the third optical path length adjustment layer 14C.

The first optical path length adjustment layer 14A, the second optical path length adjustment layer 14B, and the third optical path length adjustment layer 14C are, for example, inorganic insulating layers or the like. The organic insulating layer contains at least one kind selected from a group consisting of silicon oxide ($SiO_x$), silicon nitride ($SiN_x$), silicon oxynitride (SiON), and the like, for example.

(Protective Layer)

The protective layer 19 is provided on the first surface of the second electrode 18 and covers and protects the plurality of organic EL elements 100. The protective layer 19 curbs entrance of moisture and the like into the organic EL layer 17. The thickness of the protective layer 19 is preferably equal to or greater than 1 μm and equal to or less than 8 μm. The protective layer 19 preferably contains a material with low water permeability. The protective layer 19 contains at least one kind selected from a group consisting of silicon nitride ($SiN_x$), silicon oxide ($SiO_x$), aluminum oxide ($AlO_x$), and titanium oxide ($TiO_x$), for example. The protective layer 19 may have a single-layer structure or may have a multi-layer structure.

(Filling Resin Layer)

The filling resin layer 20 is provided between the protective layer 19 and the counter substrate 21. The filling resin layer 20 has a function as an adhesive layer for establishing adhesion between the protective layer 19 and the counter substrate 21. The filling resin layer 20 contains at least one kind selected from a group consisting of a thermosetting resin, an ultraviolet curable resin, and the like, for example.

(Counter Substrate)

The counter substrate 21 is provided so as to face the drive substrate 11. More specifically, the counter substrate 21 is provided such that the second surface of the counter substrate 21 and the first surface of the drive substrate 11 face each other. The counter substrate 21 and the filling resin layer 20 seals the plurality of organic EL elements 100 and the like. The counter substrate 21 is configured of a material such as glass that is transparent with respect to light of each color emitted from the organic EL elements 100R, 100G, and 100B.

[Method for Manufacturing Display Device]

Hereinafter, an example of a method for manufacturing the display device 10 according to the first embodiment of the present disclosure will be described with reference to FIGS. 5A to 5F and FIGS. 6A to 6D.

First, a drive circuit or the like including the thin-film transistors 11B is formed on the first surface of the substrate 11A using a thin-film formation technology, a photolithography technology, and an etching technology, for example. The drive substrate 11 is thereby obtained. Subsequently, the first insulating layer 12B is formed on the drive circuit by a spin coating method, a slit coating method, or the like, for example. Thereafter, contact holes (openings) are formed by patterning the first insulating layer 12B into a predetermined shape, and the contact plugs 12A are formed in the contact holes by using the photolithography technology and the etching technology, for example.

Figure 5:
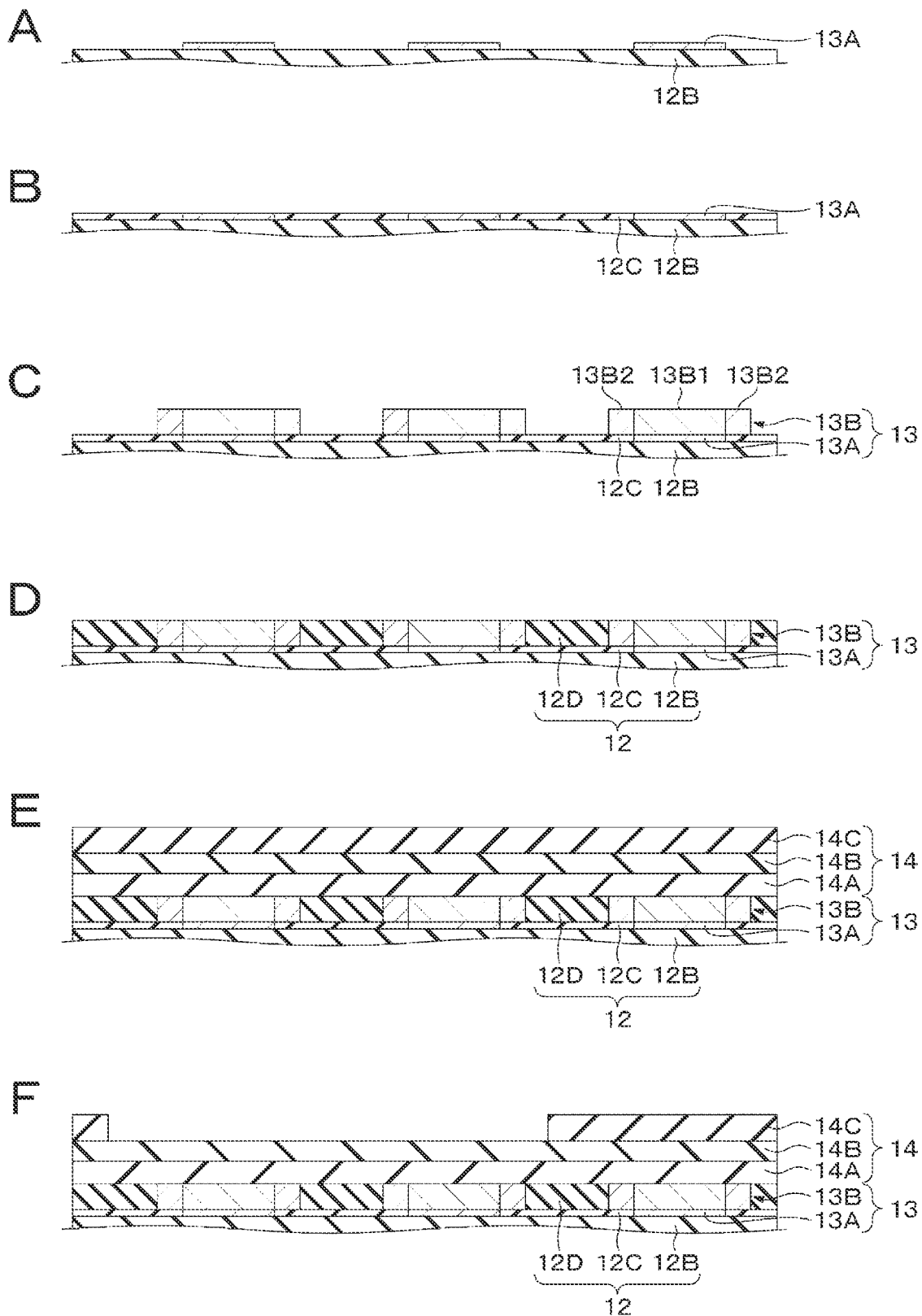

Next, a metal layer is formed on the first surface of the first insulating layer 12B by a sputtering method, for example, and the metal layer is then patterned by using a photolithography technology and an etching technology, for example. In this manner, the plurality of base layers 13A are formed on the first surface of the first insulating layer 12B as illustrated in FIG. 5A. Next, the second insulating layer 12C is formed on the first surface of the first insulating layer 12B to fill parts between the plurality of base layers 13A by a chemical vapor deposition (CVD) method, for example. Next, the second insulating layer 12C on the first surfaces of the plurality of base layers 13A is removed by an etch-back method or a chemical mechanical polishing (CMP) method, for example. In this manner, the first surfaces of the plurality of base layers 13A are exposed from the second insulating layer 12C as illustrated in FIG. 5B.

Next, a metal layer is formed on the first surface of the second insulating layer 12C by a sputtering method, for example. At this time, since crystal structures of the base layers 13A and the metal layer are similar to each other in the regions where the base layers 13A are present, crystal growth of the metal layer is promoted, and a reflectance of the metal layer increases. On the other hand, since crystal structures of the base layers 13A and the metal layer differ from each other in a region where the base layers 13A are not present, crystal growth of the metal layer is not promoted, and a reflectance of the metal layer decreases. Therefore, the two kinds of regions in which reflectance of the metal layers differs are formed in a self-organizing manner. Next, the metal layer is patterned to form the plurality of reflective layers 13B by using the photolithography technology and the etching technology, for example. In this manner, the plurality of reflective plates 13 are formed on the first surface of the second insulating layer 12C as illustrated in FIG. 5C.

Next, the third insulating layer 12D is formed on the second insulating layer 12C and the first surfaces of the reflective plates 13 to fill the parts between the plurality of reflective plates 13 by CVD, for example. Next, the third insulating layer 12D on the first surfaces of the plurality of reflective plates 13 is removed by the etch-back method or the CMP method, for example. In this manner, the first surfaces of the plurality of reflective plates 13 are exposed from the third insulating layer 12D as illustrated in FIG. 5D.

Next, the first optical path length adjustment layer 14A, the second optical path length adjustment layer 14B, and the third optical path length adjustment layer 14C are laminated in order on the third insulating layer 12D and the first surfaces of the reflective plates 13 to form the optical path length adjustment layer 14 as illustrated in FIG. 5E by CVD, for example.

Next, the first optical path length adjustment layer 14A is patterned as illustrated in FIG. 5F by using the photolithography technology and the etching technology, for example. Subsequently, the second optical path length adjustment layer 14B is patterned as illustrated in FIG. 6A by using the photolithography technology and the etching technology, for example.

Next, the contact plugs 12A are formed in the insulating layer 12, and the transparent conductive oxide layers are formed on the first surfaces of the first optical path length adjustment layer 14A, the second optical path length adjustment layer 14B, and the third optical path length adjustment layer 14C by the sputtering method, for example. Next, the transparent conductive oxide layer is patterned by using the photolithography technology and the etching technology, for example. In this manner, the plurality of first electrodes 15 are formed on the first surfaces of the first optical path length adjustment layer 14A, the second optical path length adjustment layer 14B, and the third optical path length adjustment layer 14C as illustrated in FIG. 6B.

Next, an inorganic insulating layer is formed on the first surface of the optical path length adjustment layer 14 to cover the plurality of first electrodes 15 by the sputtering method or the CVD method, for example, and the inorganic insulating layer is then patterned by using the photolithography technology and the etching technology, for example. In this manner, the inter-pixel insulating layer 16 is formed between the adjacent first electrodes 15 as illustrated in FIG. 6C.

Figure 6:
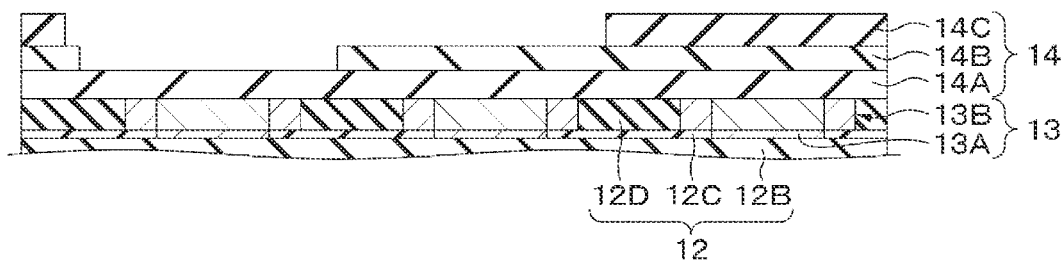
Figure 6:
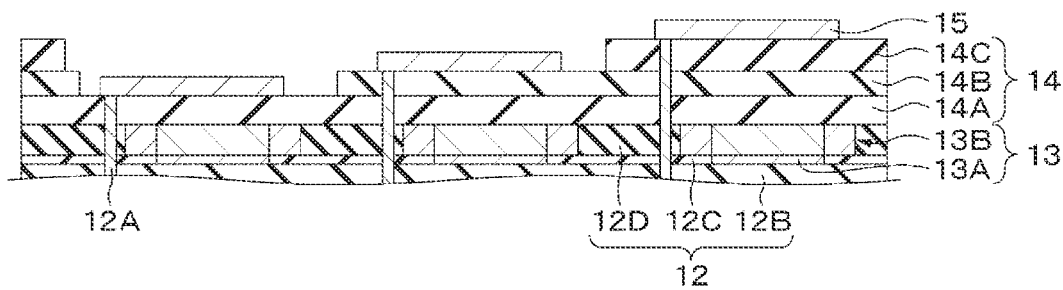
Figure 6:
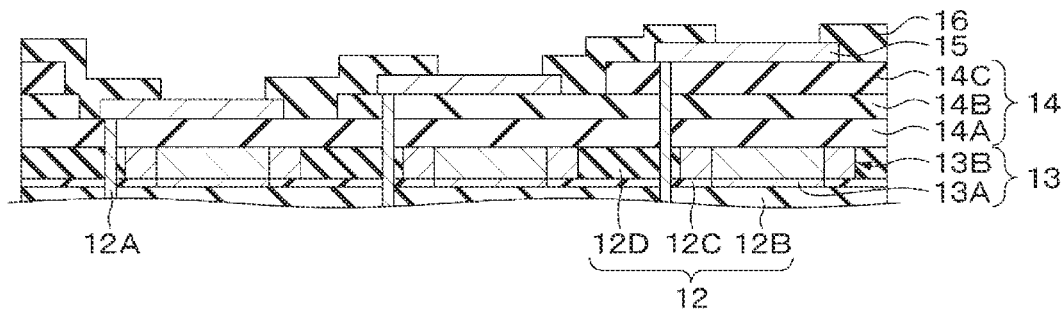
Figure 6:
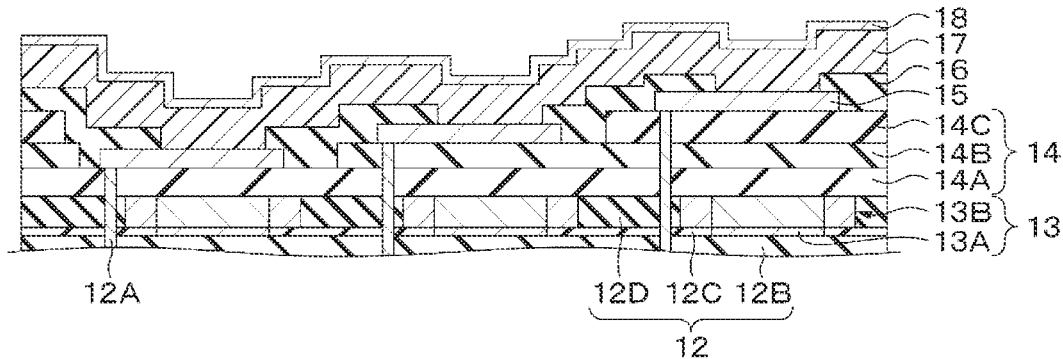

Next, the hole injection layer 17A, the hole transport layer 17B, the red light emission layer 17C, the light emission separation layer 17D, the blue light emission layer 17E, the green light emission layer 17F, the electron transport layer 17G, and the electron injection layer 17H are laminated in order on the plurality of first electrodes 15 and the first surface of the inter-pixel insulating layer 16, and the one-stack organic EL layer 17 is thereby formed, as illustrated in FIG. 6D by the deposition method, for example. Next, the second electrode 18 is formed on the first surface of the organic EL layer 17 as illustrated in FIG. 6D by the deposition method, for example. Next, the protective layer 19 is formed on the first surface of the second electrode 18 by the CVD method, for example. Next, the drive substrate 11 and the counter substrate 21 are attached via the filling resin layer 20. As described above, the display device 10 illustrated in FIG. 1 is obtained.

Operations and Effects

As described above, the reflective plates 13 include the counter surfaces 13S that face the organic EL layer 17 via the first electrodes 15 in the display device 10 according to the first embodiment. A reflectance R1 of the counter surfaces 13S in the first regions A1 and a reflectance R2 of the counter surfaces 13S in the second regions A2 satisfy a relationship of R2<R1. It is thus possible to curb extraction of light with a color, which is different from the color of light in the first regions A1, as display light in the second regions A2 and thereby to curb degradation of color purity. Therefore, it is possible to improve deterioration of chromaticity gradation.

Also, according to the method for manufacturing the display device 10 according to the first embodiment, it is possible to form the first regions A1 and the second regions A2 with a different reflectance in the reflective layers 13B in the self-organizing manner and thereby to produce the reflective plates 13 capable of curbing degradation of color purity by a simple manufacturing method.

Second Embodiment

[Configuration of Display Device]

FIG. 7 is a sectional view illustrating an example of a configuration of a display device 30 according to a second embodiment of the present disclosure. The display device 30 is different from the display device 10 according to the first embodiment in that the display device 30 includes reflective plates 33 instead of the reflective plates 13 (see FIG. 3). Also, in the second embodiment, the same parts as those in the first embodiment are denoted by the same reference numerals, and descriptions thereof will be omitted.

Counter surfaces (first surfaces) 33S of the reflective plates 33 include steps 33St at boundaries between the first regions A1 and the second regions A2. The steps 33St are raised from the second regions A2 toward the first regions A1. The boundary portions between the counter surfaces 33S of the first regions A1 and side surfaces 33SA of the steps 33St have rounded shapes.

The reflective plates 33 include base layers 13A and reflective layers 33B. Inner parts 13B1 of the reflective layers 13B and peripheral edge parts 13B2 of the reflective layers 13B are located at different heights. Second surfaces of the base layers 13A and second surfaces of the peripheral edge parts 13B2 of the reflective layers 13B are in the same plane as the second surface.

The reflective layers 33B are similar to the reflective layers 13B in the first embodiment in the other points.

[Method for Manufacturing Display Device]

Hereinafter, an example of a method for manufacturing the display device 30 according to the second embodiment of the present disclosure will be described with reference to FIGS. 5A and 8.

First, the processes until formation of the base layers 13A are performed similarly to those in the method for manufacturing the display device 10 according to the first embodiment. In this manner, the plurality of base layers 13A are formed on the first surface of the insulating layer 12 as illustrated in FIG. 5A.

Next, a metal layer is formed on the first surface of the first insulating layer 12B to cover the plurality of base layers 13A by the sputtering method, for example. Next, the metal layer is patterned by the photolithography technology and the etching technology, for example. In this manner, the reflective layers 33B having the steps 33St at the counter surfaces 33S are formed on the first surface of each base layer 13A as illustrated in FIG. 8. Next, rounded shapes are given to the boundary portions between the counter surfaces 33S of the first regions A1 and the side surfaces 33SA of the steps 33St by using the photolithography technology and the etching technology, for example.

The following processes are performed similarly to those in the method for manufacturing the display device 10 according to the first embodiment. As described above, the display device 30 illustrated in FIG. 7 is obtained.

Operations and Effects

As described above, the reflectance R1 of the counter surfaces 33S in the first regions A1 and the reflectance R2 of the counter surfaces 33S in the second regions A2 satisfy the relationship of R2<R1 in the display device 30 according to the second embodiment. Therefore, it is possible to obtain operations and effects that are similar to those of the first embodiment.

Also, the boundary portions between the counter surfaces 33S of the first regions A1 and the side surfaces 33SA of the steps 33St have rounded shapes. In this manner, it is possible to curb diffused reflection of light at the steps 33St even if the steps 33St are present at the counter surfaces 33S. It is thus possible to curb degradation of display quality.

Third Embodiment

[Configuration of Display Device]

FIG. 9 is a sectional view illustrating an example of a configuration of a display device 40 according to the third embodiment of the present disclosure. The display device 40 is different from the display device 10 according to the first embodiment in that the display device 40 does not include the optical path length adjustment layer 14 (see FIG. 1), the first electrodes 15 are adjacent to the reflective plates 13, and the thicknesses of the first electrodes 15 differ for each of the organic EL elements 100R, 100B, and 100B of the three colors.

The first electrodes 15 function as anodes and also have a function as optical adjustment layers for adjusting the optical path length between the reflective plates 13 and the second electrode 18 for each of the organic EL elements 100R, 100G, and 100B of the three colors. The thickness of the first electrodes 15 is set for each of the organic EL elements 100R, 100G, and 100B of the three colors. Specifically, the thickness of the first electrodes 15 of the red organic EL element 100R is set such that red light is resonated and emphasized. The thickness of the first electrodes 15 of the green organic EL element 100G is selected such that green light is resonated and emphasized. The thickness of the first electrodes 15 of the blue organic EL element 100G is selected such that blue light is resonated and emphasized.

[Method for Manufacturing Display Device]

Hereinafter, an example of a method for manufacturing a display device 40 according to a third embodiment of the present disclosure will be described with reference to FIGS. 5D and 10.

First, processes until the third insulating layer 12D on the first surfaces of the plurality of reflective plates 13 is removed are performed similarly to those in the method for manufacturing the display device 10 according to the first embodiment. In this manner, the first surfaces of the plurality of reflective plates 13 are exposed from the third insulating layer 12D as illustrated in FIG. 5D.

Next, after contact holes (openings) are formed in an insulating layer 12, and contact plugs 12A are formed in the contact holes. Next, a first electrode 15 is formed on the first surface of each reflective plate 13 by using the thin-film formation technology, the photolithography technology, and the etching technology, for example. At this time, the thickness of the first electrodes 15 is set to be differ for each of the organic EL elements 100R, 100B, and 100B of the three colors as illustrated in FIG. 10.

The following processes are performed similarly to those in the method for manufacturing the display device 10 according to the first embodiment. As described above, the display device 40 illustrated in FIG. 9 is obtained.

Operations and Effects

As described above, the display device 40 according to the third embodiment includes the reflective plates 13 that are similar to those in the first embodiment. Also, the display device 40 according to the third embodiment does not include the optical path length adjustment layer 14 according to the first embodiment, and the first electrodes 15 have a function of the optical adjustment layer. In this manner, it is possible to obtain operations and effects that are similar to those in the first embodiment with a simpler configuration than that of the display device 10 according to the first embodiment.

Fourth Embodiment

[Configuration of Display Device]

FIG. 11 is a sectional view illustrating an example of a configuration of a display device 50 according to a fourth embodiment of the present disclosure. The display device 50 is different from the display device 10 according to the first embodiment in that the display device 50 includes reflective plates 53 instead of the reflective plates 13 (see FIG. 3). Also, the same parts as those in the first embodiment are denoted by the same reference numerals, and descriptions thereof will be omitted in the fourth embodiment.

The reflective plates 53 include base layers 53A and reflective layers 53B. The base layers 53A are provided in first regions A1 and second regions A2. The base layers 53A have a function as a low reflective layer having a lower reflectance than that of the reflective layers 53B.

The reflective layers 53B are provided in the first regions A1 while they are not provided in the second regions A2. In other words, peripheral edges of the reflective layers 53B are located inside the peripheral edges of the base layers 53A. The first surfaces of the base layers 53A are exposed without being covered with the reflective layers 53B in the second regions A2. The reflective layers 53B are similar to the inner parts 13B1 of the reflective layers 13B in the first embodiment.

Boundary portions between counter surfaces 53S of the reflective layers 53B and side surfaces 53SA may have rounded shapes. In this manner, it is possible to curb diffused reflection of light at the boundary portions between the counter surfaces 53S and the side surfaces 53SA. It is thus possible to curb degradation of display quality.

The reflective plates 53 are similar to the reflective plates 13 in the first embodiment in the other points.

[Method for Manufacturing Display Device]

A method for manufacturing the display device 50 according to the fourth embodiment of the present disclosure is similar to that for the display device 10 according to the first embodiment in the other points. The base layers 53A are formed over the first regions A1 and the second regions A2 while the reflective layers 53B are formed only in the first regions A1. In other words, the reflective layers 53B are formed on the first surfaces of the base layers 53A such that the peripheral edges of the reflective layers 53B are located inside the base layers 53A.

Operations and Effects

As described above, the first surfaces of the base layers 53A are exposed without being covered with the reflective layers 53B in the second regions A2 in the display device 50 according to the fourth embodiment. Also, the base layers 53A have a function as the low reflective layer having a lower reflectance than that of the reflective layers 53B. In this manner, a reflectance $R1$ of the counter surfaces 53S in the first regions A1 and a reflectance $R2$ of the counter surfaces 53S in the second regions A2 can satisfy the relationship of $R2<R1$. Therefore, it is possible to obtain operations and effects that are similar to those in the first embodiment by using the reflective plates 53 with a simpler configuration.

Fifth Embodiment

[Configuration of Display Device]

FIG. 12 is a sectional view illustrating an example of a configuration of a display device 60 according to the fifth embodiment of the present disclosure. The display device 60 is different from the display device 50 according to the fourth embodiment in that the display device 60 includes reflective plates 63 instead of the reflective plates 53 (see FIG. 11). Here, the same parts as those in the fourth embodiment will be denoted with the same reference numerals, and descriptions thereof will be omitted in the fifth embodiment.

The reflective plates 63 include base layers 53A, reflective layers 53B, and light absorption layers 63C. The light absorption layers 63C are provided on the first surfaces of the base layers 53A and in the second regions A2. The light absorption layers 63C absorb light output from the organic EL layer 17. The light absorption layers 63C contain, for example, titanium nitride (TiN) or the like.

[Method for Manufacturing Display Device]

A method for manufacturing the display device 60 according to the fifth embodiment of the present disclosure is similar to that for the display device 50 according to the fourth embodiment in the other points. The light absorption layers 63C are formed in the second regions A2 on the first surfaces of the base layers 53A by using the thin-film formation technology, the photolithography technology, and the etching technology, for example, after the process for forming the reflective layers 53B and before the process for forming the optical path length adjustment layer 14.

Operations and Effects

As described above, the reflective plates 63 include the base layers 53A, the reflective layers 53B, and the light absorption layers 63C in the display device 60 according to the fifth embodiment. The light absorption layers 63C are provided on the first surfaces of the base layers 53A and in the second regions A2. In this manner, it is possible to reduce the reflectance R2 of the counter surfaces 63S in the second regions A2 than that in the display device 10 according to the first embodiment. It is thus possible to curb degradation of color purity in the display device 60 according to the fifth embodiment as compared with the display device 10 according to the first embodiment.

Sixth Embodiment

[Configuration of Display Device]

FIG. 13 is a sectional view illustrating an example of a configuration of a display device 70 according to the sixth embodiment of the present disclosure. FIG. 14 is a sectional view showing a part of FIG. 13 in an enlarged manner. The display device 70 is different from the display device 10 according to the first embodiment in that an insulating layer 12 includes a plurality of placement layers 12E. Note that the same parts will be denoted by the same reference signs as those in the first embodiment and description thereof will be omitted in the sixth embodiment. In the sixth embodiment, regions between adjacent second regions A2, that is, inter-pixel regions between the adjacent sub-pixels 101 in a plan view will be referred to as third regions A3.

The placement layers 12E are provided on the further side than the reflective plates 13 when seen from first electrodes 15. At least some of the placement layers 12E are provided in the third regions A3 of the insulating layer 12. The placement layers 12E may extend up to the second regions A2 or may extend up to the first regions A1 beyond the second regions A2.

The placement layers 12E include counter surfaces 12ES that face the organic EL layer 17. A reflectance R3 of the counter surface 12ES and the reflectance R1 of the counter surfaces 13S in the first regions A1 (that is, the reflectance R1 of the counter surfaces 13S of the inner parts 13B1) satisfy the relationship of R3<R1.

Here, the reflectance R3 is assumed to mean average reflectance of wavelength bands of visible light. The wavelength bands of visible light are wavelength bands of equal to or greater than 360 nm and equal to or less than 830 nm. Also, in a case where the reflectance R3 changes depending on positions in the third regions A3, the reflectance R3 is assumed to mean a reflectance at a position where the reflectance R3 is maximum in the third regions A3.

The placement layers 12E are, for example, wiring layers, light blocking layers, or laminated bodies thereof. The placement layers 12E connect the organic EL elements 100 to the drive substrate 11. The placement layers 12E are, for example, metal wiring layers.

The light blocking layer blocks light that is incident on the drive substrate 11. The light blocking layer contains a light absorption material. The light absorption material contains at least one kind selected from a group consisting of titanium nitride (TiN) and carbon materials, for example. In a case where the placement layers 12E are laminated bodies each including the wiring layer and the light blocking layer, the light blocking layer is preferably provided on the first surface of the wiring layer from the viewpoint of curbing reflection of the light.

[Method for Manufacturing Display Device]

A method for manufacturing the display device 50 according to the sixth embodiment of the present disclosure is similar to the method for manufacturing the display device 10 according to the first embodiment other than that the placement layers 12E are formed in the insulating layer 12 in the process for forming the insulating layer 12.

Operations and Effects

As described above, the insulating layer 12 includes the plurality of placement layers 12E in the display device 70 according to the sixth embodiment. Also, the reflectance R3 of the counter surfaces 12ES and the reflectance R1 of the counter surfaces 13S in the first regions A1 satisfy the relationship of R3<R1. It is thus possible to further effectively curb influences of unintended light emission at the peripheral edge parts of the sub-pixels 101.

Seventh Embodiment

FIG. 15 is a sectional view illustrating an example of a configuration of a display device 80 according to the seventh embodiment of the present disclosure. The display device 80 is different from the display device 10 according to the first embodiment in that the display device 80 includes a plurality of microlenses 81 provided on a first surface of a protective layer 19.

Although an example in which a filling resin layer 20 and a counter substrate 21 are not provided on a first surface of a protective layer 19 is illustrated in FIG. 15, the filling resin layer 20 and the counter substrate 21 may be provided on the first surface of the protective layer 19. In this case, a part between the protective layer 19 and the counter substrate 21 is preferably filled with the filling resin layer 20 to fill recessed portions between the microlenses 81.

The microlenses 81 are, for example, on-chip microlenses (OCL). The microlenses 81 are an example of a light collecting structure. The plurality of microlenses 81 are two-dimensionally aligned in an in-plane direction of the display surface. The microlenses 81 are provided for each organic EL element 100.

Each microlens 81 is provided to face the organic EL element 100R, the organic EL element 100G, and the organic EL element 100B. In this manner, red light, green light, and blue light emitted from the organic EL element 100R, the organic EL element 100G, and the organic EL element 100B are collected by the microlens 81 toward the front surface of the display device 10 and are then emitted from the display surface. Therefore, light utilization efficiency in the front surface direction is enhanced.

The microlenses 81 are configured of an inorganic material that is transparent with respect to light of each color emitted from the organic EL element 100R, the organic EL element 100G, and the organic EL element 100B or a polymer resin. As the inorganic material, it is possible to use, for example, silicon oxide ($SiO_2$). As the polymer resin, it is possible to use, for example, a photosensitive resin.

[Method for Manufacturing Display Device]

A method for manufacturing the display device 80 according to the seventh embodiment is similar to that of the display device 10 according to the first embodiment in that the plurality of microlenses 81 are formed on the first surface of the protective layer 19 after the process for forming the protective layer 19.

Operations and Effects

As described above, the plurality of microlenses 81 are provided on the first surface of the protective layer 19 in the display device 80 according to the seventh embodiment, it is possible to efficiently extract light resonated by the resonator structure 102 to the outside.

Eighth Embodiment

[Overview]

In the display device having a resonator structure, steps caused by differences in thicknesses of the optical adjustment layer in each layer formed above the optical adjustment layer occurs between adjacent sub-pixels due to the difference in thickness of the optical adjustment layer between the reflective layers and the first electrodes for each sub-pixel. If there are steps on the surface of the second electrode, cracking is likely to occur in the protective layer on the organic EL elements. Once moisture, oxygen, or the like enters the inside from the cracking, there is a concern that the entering moisture, oxygen, or the like may cause a reaction with a material (MgAg, for example) constituting the second electrode, which may lead to deterioration of properties of the organic EL elements and degradation of reliability.

Thus, a configuration in which an adsorption layer that adsorbs moisture and oxygen is provided on the second electrode has been proposed (see JP 2017-182892 A). However, there is a problem that if the thickness of the adsorption layer is increased to improve reliability in such a configuration, the increase may affect optical properties. In other words, there is a problem that the optical properties of the organic EL elements and the reliability are in a trade-off relationship and it is difficult to achieve both of them. This is because the material configured of the absorption layer absorbs light to some extent, light absorption increases if the thickness of the adsorption layer is increased, and light extraction efficiency of the organic EL elements is degraded.

In the eighth embodiment, a display device capable of achieving both the optical properties of the organic EL elements and the reliability by causing a ratio of thicknesses of the second electrode and the adsorption layer to be different in accordance with regions will be described.

[Configuration of Display Device]

FIG. 16 is a sectional view illustrating an example of a configuration of a display device 90 according to the eighth embodiment of the present disclosure. FIG. 17 is a plan view illustrating an example of a configuration of the sub-pixels 101R, 101G, and 101B. FIG. 18 is a sectional view showing a part of FIG. 16 in an enlarged view. The display device 90 is different from the display device 10 according to the first embodiment in that the display device 90 further includes an adsorption layer 91 and includes reflective plates 93 instead of the reflective plates 13. Note that parts similar to those in the first embodiment are denoted by the same reference signs and the description thereof will be omitted in the eighth embodiment. In the eighth embodiment, regions (pixel opening regions) corresponding to openings 16A in a plan view will be referred to as first regions B1, and regions (inter-pixel regions) between the adjacent openings 16A in a plan view will be referred to as second regions B2.

The sub-pixels 101 have, for example, a rectangular shape. The plurality of sub-pixels 101 are aligned in a matrix shape. One or two or more steps 91St are provided in the second regions B2. Note that FIG. 16 illustrates an example in which one step 91St is provided in the second regions B2. In the second regions B2, the thickness of the adsorption layer 91 in a side surface (inclined surface) 91SA of the step 91St is thicker than the thicknesses of the adsorption layers 91 at locations other than the side surface 91SA. In the second regions B2, the thickness of the adsorption layer 91 may be locally thicker at the side surface 91SA of the step 91St. Note that in a case where there are two or more steps 91St, the thickness of the adsorption layer 91 at the side surface 91SA of each step 91St is thicker than the thicknesses of the adsorption layers 91 at locations other than the side surfaces 91SA.

The adsorption layer 91 is provided on the first surface of the second electrode 18. The filling resin layer 20 is provided on the first surface of the adsorption layer 91. The adsorption layer 91 adsorbs moisture, oxygen, and the like. In a case where an average thickness of the second electrode 18 in the first regions B1 is defined as TCA, an average thickness of the adsorption layer 91 in the first regions B1 is defined as TKA, an average thickness of the second electrode 18 in the second regions B2 is defined as TCB, and an average thickness of the adsorption layer 91 in the second regions B2 is defined as TKB, a relationship of TKA/TCA<TKB/TCB is satisfied.

The average thicknesses TKA, TCA, TKB, and TCB are obtained as follows. First, a section of the display device 90 is cut by Cryo focused ion beam (FIB) working or the like, and a thin piece is produced. Then, the produced thin piece is observed by a transmission electron microscope (TEM), and one section TEM image is acquired. At this time, an acceleration voltage is set to 80 kV. Next, the acquired section TEM image is used to measure the thickness of the second electrode 18 at ten points in the first region B1 and measure the thickness of the adsorption layer 91 at ten points in the first regions B1. At this time, each of the measurement points of the thicknesses of the second electrode 18 and the thicknesses of the adsorption layer 91 is randomly selected from the first regions B1. Also, the thicknesses of the second electrode 18 are the thicknesses of the second electrode 18 in a tangential line direction at the interface between the organic EL layer 17 and the second electrode 18, and the thicknesses of the adsorption layer 91 are thicknesses of the adsorption layer 91 in the tangential line direction at the interface between the second electrode 18 and the adsorption layer 91. Thereafter, an average (arithmetic average) of the thicknesses of the second electrode 18 measured at the ten points is simply obtained to obtain the average thickness TCA of the second electrode 18, and an average (arithmetic average) of the thicknesses of the adsorption layer 91 measured at ten points is simply obtained to obtain the average thickness TKA of the adsorption layer 91.

Next, the acquired section TEM image is used to measure the thicknesses of the second electrode 18 at ten points in the side surfaces 91SA of the steps 91St of the second regions B2 and measure the thicknesses of the adsorption layer 91 at ten points in the side surfaces 91SA of the steps 91St of the second regions B2. At this time, each of the measurement points of the thicknesses of the second electrode 18 and the thicknesses of the adsorption layer 91 is randomly selected from the side surfaces 91SA of the steps 91St of the second regions B2. Also, the thicknesses of the second electrode 18 are thicknesses of the second electrode 18 in the tangential line direction at the interface between the organic EL layer 17 and the second electrode 18, and the thicknesses of the adsorption layer 91 are the thicknesses of the second electrode 18 in the tangential line direction at the interface between the second electrode 18 and the adsorption layer 91. Thereafter, an average (arithmetic average) of the thicknesses of the second electrode 18 measured at the ten points is simply obtained to obtain the average thickness TCB of the second electrode 18, and an average (arithmetic average) of the thicknesses of the adsorption layer 91 measured at the ten points is obtained to obtain the average thickness TKB of the adsorption layer 91.

Note that in a case where there are two or more steps 91St in the second regions B2, the average thickness of the second electrode 18 is obtained at each step 91St, and the maximum average thickness of the second electrode 18 among them is defined as the average thickness TCB of the second electrode 18. Similarly, in a case where there are two or more steps 91St in the second regions B2, the average thickness of the adsorption layer 91 is obtained at each step 91St, and the maximum average thickness of the adsorption layer 91 among them is defined as the average thickness TKB of the adsorption layer 91.

The second electrode 18 and the adsorption layer 91 configure a laminated film 92. A transmittance T2 of the laminated film 92 in the second regions B2 is preferably higher than a transmittance T1 of the laminated film 92 in the first regions B1. In this manner, a cavity effect in the second regions B2 (the peripheral edge parts of the openings 16A of the sub-pixels 101, for example) is weakened, and it is thus possible to curb extraction of light with a color, which is different from that in the first region B1 (the parts of the openings 16A of the sub-pixels 101), as display light in the second regions B2 (the peripheral edge parts of the openings 16A of the sub-pixels 101, for example) in the resonator structure 102. Therefore, the organic EL layer 17 is provided commonly for all the sub-pixels 101, and it is possible to curb extraction of light with a color that is different from that of the sub-pixels 101 at the peripheral edge parts of the sub-pixels 101 in the display device 90 having the resonator structure 102 and to curb degradation of color purity. In other words, it is possible to deteriorate of chromaticity gradation.

Here, the transmittance T1 and T2 is assumed to mean the average transmittance of the wavelength bands of visible light. The wavelength bands of visible light are wavelength bands of equal to or greater than 360 nm and equal to or less than 830 nm as described above. Also, in a case where the transmittance T1 changes depending on positions in the first regions B1, the transmittance T1 is assumed to mean the transmittance at the position where the transmittance T1 is maximum in the first regions B1. Similarly, in a case where the transmittance T2 changes depending on positions in the second regions B2, the transmittance T2 is assumed to mean the transmittance at the position where the transmittance T2 is maximum in the second regions B2.

In a case where the adsorption layer and the second electrode are assumed to have the same thickness, the transmittance T2 of the adsorption layer 91 is preferably higher than the transmittance T1 of the second electrode 18. In this manner, the transmittance T2 of the laminated film 92 in the second regions B2 is easily set to be higher than the transmittance T1 of the laminated film 92 in the first regions B1 even in a case where the TKA, TCA, TKB, and TCB satisfy the relationship of TKA/TCA<TKB/TCB.

The oxygen content of the laminated film 92 in the second region B2 is preferably higher than the oxygen content of the laminated film 92 in the first regions B1. In this manner, the transmittance T2 of the laminated film 92 in the second regions B2 can be set to be higher than the transmittance T1 of the laminated film 92 in the first regions B1. The oxygen content of the laminated film 92 can be obtained by performing composition analysis in the thickness direction of the laminated film 92 and acquiring a composition profile (depth profile).

The adsorption layer 91 contains a material that adsorbs moisture and oxygen. Specifically, the adsorption layer 91 contains at least one kind selected from a group consisting of alkali metal, alkali earth metal, aluminum (Al), and the like. Alkali metal contains at least one kind selected from a group consisting of lithium (Li), sodium (Na), potassium (K), rubidium (Rb), Cesium (Cs), and francium (Fr), for example. Alkali earth metal contains at least one kind selected from a group consisting of beryllium (Be), magnesium (Mg), calcium (Ca), strontium (Sr), barium (Ba), and radium (Ra), for example. The adsorption layer 91 may contain a compound containing, as a main constituent, at least one kind of metal selected from a group consisting of alkali metal and alkali earth metal. The compound is, for example, oxide, carbonate, fluoride, or the like.

The reflective plates 93 include base layers 93A and reflective layers 93B. The base layers 93A are similar to the base layers 53A in the fourth embodiment. The reflective layers 93B are similar to the inner parts 13B1 of the reflective layers 13B in the first embodiment other than that the reflective layers 93B have the same shape and size as those of the base layers 93A.

[Method for Manufacturing Display Device]

Hereinafter, an example of a method for manufacturing the display device 30 according to the eighth embodiment of the present disclosure will be described with reference to FIGS. 19A to 19E.

First, a drive circuit or the like including the thin-film transistors 11B is formed on the first surface of the substrate 11A using a thin-film formation technology, a photolithography technology, and an etching technology, for example. The drive substrate 11 is thereby obtained. Subsequently, the first insulating layer 12B is formed on the drive circuit by a spin coating method, a slit coating method, or the like, for example. Thereafter, contact holes (openings) are formed by patterning the first insulating layer 12B into a predetermined shape, and the contact plugs 12A are formed in the contact holes by using the photolithography technology and the etching technology, for example.

Figure 19:
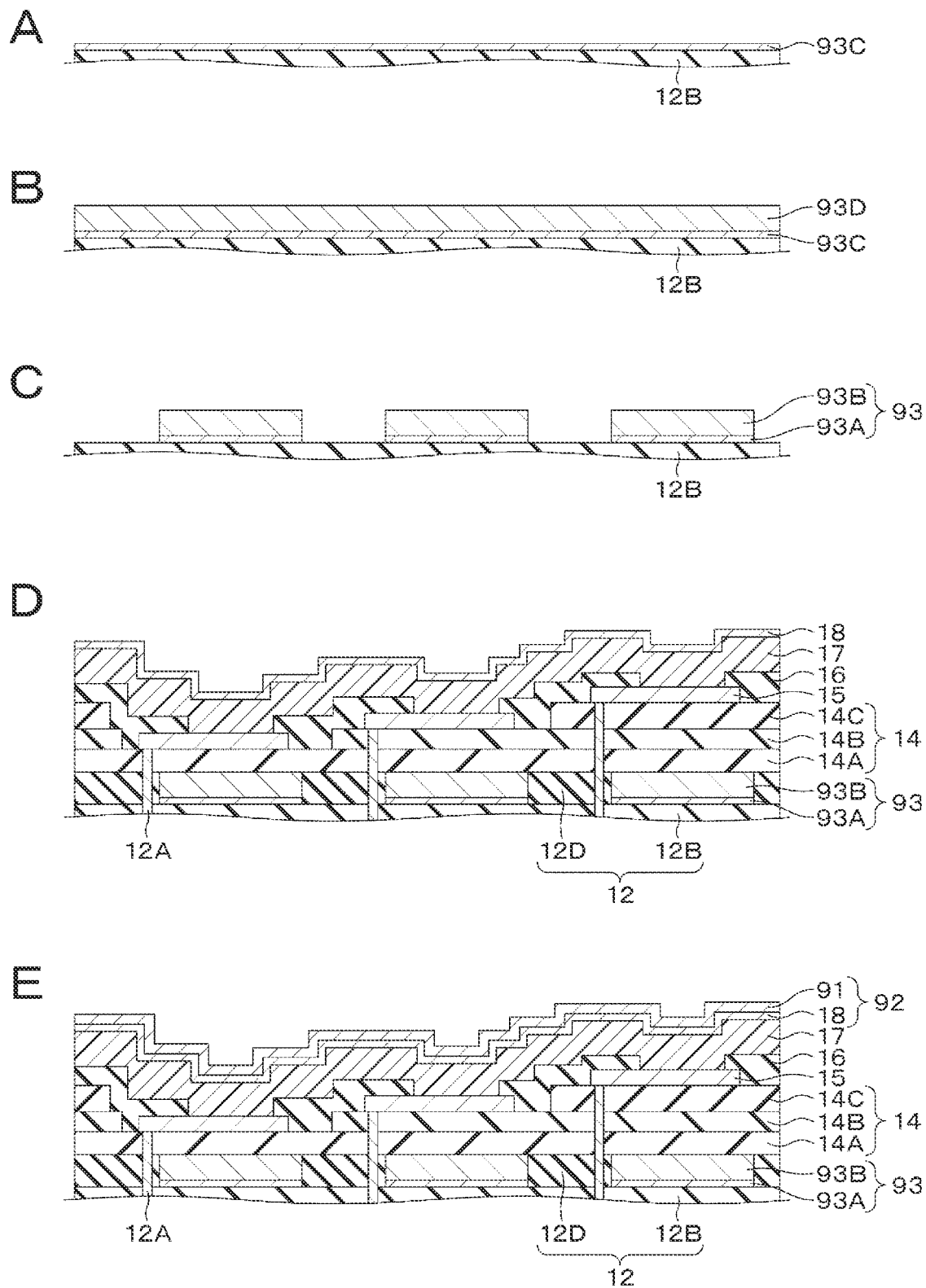

Next, a metal layer 93C is formed on the first surface of the first insulating layer 12B as illustrated in FIG. 19A by the sputtering method, for example. Next, a metal layer 93D is formed on the first surface of the metal layer 93C as illustrated in FIG. 19B by the sputtering method, for example. Next, the metal layer 93C and the metal layer 93D are patterned by using the photolithography technology and the etching technology, for example. In this manner, the plurality of reflective plates 93 are formed in the first surface of the first insulating layer 12B as illustrated in FIG. 19C. Next, processes from the process for forming the third insulating layer 12D to the process for forming the organic EL layer 17 are performed similarly to the first embodiment.

Next, the second electrode 18 is formed on the first surface of the organic EL layer 17 as illustrated in FIG. 19D by the deposition method, for example. Next, the adsorption layer 91 is formed on the first surface of the second electrode 18 as illustrated in FIG. 19E by the deposition method, for example. Next, processes from the process for forming the protective layer 19 to the process for attaching the counter substrate 21 are performed similarly to the first embodiment. As described above, the display device 10 illustrated in FIG. 16 is obtained.

Here, details of the aforementioned process for forming the second electrode 18 and the forming process for forming the adsorption layer 91 will be described with reference to FIGS. 20A, 20B, 21A, and 21B. In the process for forming the second electrode 18 and the process for forming the adsorption layer 91, rotation deposition of forming the films while rotating the drive substrate 11 that is a target of film formation is used. In the method for manufacturing the display device 90 according to the eighth embodiment, the offset amount D1 of a deposition source 18M in the process for forming the second electrode 18 is different from the offset amount D2 of a deposition source 91M in the process for forming the adsorption layer 91. Here, the offset amount D1 in the process for forming the second electrode 18 means the offset amount of the deposition source (first deposition source) 18M with respect to the rotation axis of the drive substrate 11 (see FIG. 20B). The offset amount D2 in the process of forming the adsorption layer 91 means the offset amount of the deposition source (second deposition source) 91M with respect to the rotation axis of the drive substrate 11 (see FIG. 21B).

In the rotation deposition, deposition is typically performed with the deposition sources 18M and 91M arranged at the positions offset with respect to the rotation shaft of the drive substrate 11. However, if the offset amount D1 of the deposition source 18M in the process for forming the second electrode 18 and the offset amount D2 of the deposition source 91M in the process for forming the adsorption layer 91 are substantially the same, the second electrode 18 and the adsorption layer 91 have substantially similar covering properties, and the relationship of TKA, TCA, TKB, and TCB is TKA/TCA≈TKB/TCB.

On the other hand, in the method for manufacturing the display device 90 according to the eighth embodiment, the arrangement positions of the deposition source 18M and the deposition source 91M are set such that the offset amount D2 of the deposition source 91M in the process for forming the adsorption layer 91 is larger than the offset amount D1 of the deposition source 18M in the process for forming the second electrode 18 as illustrated in FIGS. 20B and 21B. The ratio of the thickness of the adsorption layer 91 with respect to the thickness of the second electrode 18 increases in the side surfaces (inclined surfaces) 91SA of the steps 91S as illustrated in FIGS. 20A and 21A by performing the deposition under such film formation conditions, and as a result, the relationship of TKA, TCA, TKB, and TCB becomes TKA/TCA<TKB/TCB.

Operations and Effects

As described above, the steps 91St of the second regions B2 are used, and the proportion of the adsorption layer 91 is set to be locally higher in the second regions B2 (the regions between the sub-pixels 101) in the display device 90 according to the eighth embodiment. In this manner, the TKA, TCA, TKB, and TCB satisfy the relationship of TKA/TCA<TKB/TCB. Therefore, it is possible to improve reliability while curbing influences on optical properties of the organic EL elements 100 in the first regions B1. Therefore, it is possible to achieve both the optical properties of the organic EL elements 100 and the reliability.

In a case where the transmittance T2 of the laminated film 92 in the second regions B2 is higher than the transmittance T1 of the laminated film 92 in the first regions B1, the organic EL layer 17 is provided commonly for all the sub-pixels 101, and it is possible to curb extraction of light with a color that is different from that of the sub-pixels 101 in the second regions B2 (the peripheral edge parts of the sub-pixels 101, for example) and to curb degradation of color purity in the display device 90 having the resonator structure 102. In other words, it is possible to deterioration of chromaticity gradation.

9 Modification Examples

Modification Example 1

As illustrated in FIG. 22 the display device 10 may include color filters 22 in the first embodiment. The color filters 22 are, for example, an on-chip color filters (OCCF) and are provided on the first surface of the protective layer 19. In this case, the filling resin layer 20 is provided on the first surfaces of the color filters 22.

The color filters 22 include, for example, a red filter 22R, a green filter 22G, and a blue filter 22B. The red filter 22R, the green filter 22G, and the blue filter 22B are provided to face the organic EL element 100R, the organic EL element 100G, and the organic EL element 100B, respectively. In this manner, red light, green light, and blue light emitted from the organic EL element 100R, the organic EL element 100G, and the organic EL element 100B transmit through the aforementioned red filter 22R, the green filter 22G, and the blue filter 22B, respectively. In this manner, the red light, the green light, and the blue light with high color purity are emitted from the display surface.

It is possible to enhance color purity of the light generated by the organic EL elements 100R, 100G, and 100B and to extract the light by the organic EL elements 100R, 100G, and 100B including the resonator structures 102R, 102G, and 102B and including the color filters 22 in the display device 10.

Light blocking layers (not illustrated) such as black matrices may be provided among the color filters 22R, 22G, and 22B of each color. In this manner, external light reflected by wirings and the like among the organic EL elements 100 is absorbed, and contrast can be improved.

Although the example in which the color filters 22 are on-chip color filters has been described in Modification Example 1 described above, the color filter 22 may be a counter color filter provided on the second surface of the counter substrate 21. In this case, a light blocking layer may be further provided on the second surface of the counter substrate 21.

Note that the display devices 30, 40, 50, 60, 70, 80, and 90 according to the second to eighth embodiments may similarly include the color filters 22. Note that the color filters 22 may be included between the protective layer 19 and the microlenses 81 in the display device 80 according to the seventh embodiment.

Modification Example 2

Although the example in which the drive substrate 11 is provided with a light collecting structure such as the microlenses 81 in order to enhance light extraction efficiency has been described in the seventh embodiment, the counter substrate 21 may be provided with the light collecting structure such as the microlenses 81.

Modification Example 3

Although the example in which the plurality of sub-pixels 101 with rectangular shapes are arranged in a matrix shape has been described in the eighth embodiment, the shape and the alignment of the sub-pixels 101 are not limited to those in this example, and it is possible to employ various shapes and alignments for the sub-pixels 101 as illustrated in FIGS. 23, 24, and 25. It is also possible to employ various shapes and alignment for the sub-pixels 101 in a similar manner in the first to seventh embodiments.

Modification Example 4

In the first embodiment, an optical layer provided on the side of the first surface or on the side of the second surface of the second electrode 18 may be further included. In this case, the reflective plates 93 (see FIG. 16) in the eighth embodiment may be included instead of the reflective plates 13 (see FIG. 1) in the first embodiment. The second electrode 18 and the optical layer may configure a laminated film.

A reflectance R4 of the laminated film in the first regions A1 and a reflectance R5 of the laminated film in the second regions A2 preferably satisfy a relationship of R5<R4. It is thus possible to curb extraction of light with a color, which is different from the color of light in the first regions A1, as display light in the second regions A2 and thereby to curb degradation of color purity. The optical layer may be a layer for lowering the reflectance R5 of the laminated film. The optical layer may be the adsorption layer 91 in the eighth embodiment. The reflectance R4 and R5 is an average reflectance of wavelength bands of visible light, and details of the definitions of the reflectance R4 and R5 are similar to the definitions of the reflectance R1 and R2 described in the first embodiment.

Modification Example 5

Although the example in which the adsorption layer 91 is provided to be adjacent to the side of the first surface of the second electrode 18 has been described in the eighth embodiment, the adsorption layer 91 may be provided to be adjacent to the side of the second surface of the second electrode 18. In this case, the adsorption layer 91 may also have the function of the second electrode 18, that is, the function of the cathode. The adsorption layer 91 may contain a constituent material of the second electrode 18 (that is, the constituent material of the cathode). The adsorption layers 91 may be included on both the side of the first surface and the side of the second surface of the second electrode 18.

10. Application Examples (Electronic Apparatuses)

The display devices 10, 30, 40, 50, 60, 70, 80, and 90 (hereinafter, referred to as "display devices 10 and the like") according to the aforementioned first to eighth embodiments and modification examples thereof may be included in various electronic apparatuses. Particularly, it is preferable that the display devices be included in electronic viewfinder of a video camera or a single-lens reflex camera, a head-mounted display, or the like, which requires high resolution, in which the display devices are used for enlargement near eyes.

Specific Example 1

FIGS. 26A and 26B illustrate an example of an appearance of a digital still camera 310. The digital still camera 310 is of a lens exchange-type single-lens reflex type and includes an exchange-type imaging lens unit (exchange lens) 312 substantially at the center of the front surface of a camera main body (camera body) 311 and a grip portion 313 that is for allowing a person who captures an image to grip it and that is provided on the left side of the front surface.

A monitor 314 is provided at a position deviating from the center of the back surface of the camera main body 311 on the left side. An electronic viewfinder (eyepiece window) 315 is provided above the monitor 314. The person who captures an image can visually recognize a light image of an object derived by the imaging lens unit 312 and to determine the composition by viewing it through the electronic viewfinder 315. As the electronic viewfinder 315, it is possible to use any of the display devices 10 and the like.

Specific Example 2

FIG. 27 illustrates an example of an appearance of a head-mounted display 320. The head-mounted display 320 has, for example, ear hooks 322 on both sides of an eyeglass-shaped display unit 321 to be worn on the user's head. As the display unit 321, any one of the display devices 10 and the like can be used.

Specific Example 3

FIG. 28 illustrates an example of an appearance of a television device 330. This television device 330 has, for example, a video display screen unit 331 including a front panel 332 and a filter glass 333, and the video display screen unit 331 is configured of any one of the display devices 10 and the like.

Although the first to eighth embodiments of the present disclosure and modification examples thereof have been specifically described above, the present disclosure is not limited to the aforementioned first to eighth embodiments and modification examples thereof, and various modifications based on the technical idea of the present disclosure can be made.

For example, the configurations, methods, processes, shapes, materials, numerical values, and the like given in the aforementioned first to eighth embodiments and the modification examples thereof are merely examples, and different configurations, methods, processes, shapes, materials, numerical values, and the like may be used as needed.

The configurations, methods, processes, shapes, materials, numerical values, and the like in the aforementioned first to eighth embodiments and the modification examples thereof can be combined with each other without departing from the gist of the present disclosure.

Unless otherwise specified, the materials exemplified in the aforementioned first to eighth embodiment and the modification examples thereof may be used alone or two or more thereof may be used in combination.

In addition, the present disclosure may have the following constitutions.

(1) A display device including: a plurality of first electrodes that are two-dimensionally disposed; a second electrode that is provided to face first surfaces of the plurality of first electrodes; an electroluminescence layer that is provided between the plurality of first electrodes and the second electrode; insulating layers that are provided between the adjacent first electrodes; and a plurality of reflective plates that are provided to face second surfaces of the plurality of first electrodes, respectively, in which a plurality of resonator structures for resonating light emitted from the electroluminescence layer are configured of the second electrode and the plurality of reflective plates, the insulating layers have a plurality of openings, the openings are provided above the first surfaces of the first electrodes, the reflective plates have counter surfaces that face the electroluminescence layer via the first electrodes, and in a case where regions corresponding to the openings in a plan view are defined as first regions and regions corresponding to peripheral edge parts of the openings in the plan view are defined as second regions, a reflectance R1 on the counter surfaces in the first region and a reflectance R2 on the counter surfaces in the second regions satisfy a relationship of R2<R1.

(2) The display device according to (1), in which the electroluminescence layer is provided commonly for all sub-pixels.

(3) The display device according to (1) or (2), in which crystallinity of the reflective plates differs between the first regions and the second regions.

(4) The display device according to any one of (1) to (3), in which the reflective plates include base layers and reflective layers provided on the base layers.

(5) The display device according to (4), in which the base layers are provided in the first regions, and the reflective layers are provided in the first regions and the second regions.

(6) The display device according to (4), in which the base layers are provided in the first regions and the second regions, and the reflective layers are provided in the first regions.

(7) The display device according to any one of (4) to (6), in which the base layers contain at least one kind selected from a group consisting of titanium, titanium nitride, and titanium oxide, and the reflective layers contain at least one kind selected from a group consisting of aluminum and an aluminum alloy.

(8) The display device according to any one of (1) to (7), in which the counter surfaces have steps at boundaries between the first regions and the second regions, the steps are raised from the second regions toward the first regions, and boundary portions between the counter surfaces in the first regions and side surfaces of the steps have rounded shapes.

(9) The display device according to any one of (1) to (8), in which sizes of irregularity on the counter surfaces differ between the first regions and the second regions.

(10) The display device according to any one of (1) to (9), in which the reflective plates are adjacent to the second surfaces of the first electrodes, and the thickness of the first electrodes differs for sub-pixels of each color.

(11) The display device according to (1) or (2), in which the reflective plates include reflective layers provided in the first regions and light absorption layers provided in the second regions.

(12) The display device according to any one of (1) to (11), further including: placement layers that are provided on a side further away than the reflective plates when seen from the first electrodes, in which the placement layers each have a counter surface that faces the electroluminescence layer, in a case where regions corresponding to parts between the adjacent reflective plates in the plan view are defined as third regions, at least a part of the placement layers is provided in the third regions, and the reflectance R1 and a reflectance R3 in the counter surface of the placement layers in the third regions satisfy a relationship of R3<R1.

(13) The display device according to any one of (1) to (12), further including: an optical layer that is provided on a side of a first surface or a side of a second surface of the second electrode, in which the second electrode and the optical layer configure a laminated film, and a reflectance R4 on the laminated film in the first regions and a reflectance R5 on the laminated film in the second regions satisfy a relationship of R5<R4.

(14) A display device including: a plurality of first electrodes that are two-dimensionally disposed; a second electrode that is provided to face first surfaces of the plurality of first electrodes; an electroluminescence layer that is provided between the plurality of first electrodes and the second electrode; insulating layers that are provided between the adjacent first electrodes; a plurality of reflective plates that are provided to face second surfaces of the plurality of first electrodes, respectively; and an adsorption layer that is provided on a side of a first surface or a side of a second surface of the second electrode, in which a resonator structure that resonates light emitted from the electroluminescence layer is configured of the second electrode and each of the reflective plates, the insulating layers have a plurality of openings, the openings are provided above the first surfaces of the first electrodes, the second electrode and the adsorption layer configure a laminated film, and in a case where regions corresponding to the openings in a plan view are defined as first regions, and regions corresponding to parts between the adjacent openings in the plan view are defined as second regions, a transmittance of the laminated film in the second regions is higher than a transmittance of the laminated film in the first regions.

(15) The display device according to (14), in which an average thickness TCA of the second electrode in the first regions, an average thickness TKA of the adsorption layer in the first regions, an average thickness TCB of the second electrode in the second regions, and an average thickness TKB of the adsorption layer satisfy a relationship of TKA/TCA<TKB/TCB.

(16) The display device according to (14) or (15), in which the second surface of the second electrode faces the first electrodes, and the adsorption layer is provided on the side of the first surface of the second electrode.

(17) The display device according to (14) or (15), in which the second surface of the second electrode faces the first electrodes, and the adsorption layer is provided on the side of the second surface of the second electrode.

(18) The display device according to any one of (14) to (17), in which the oxygen content in the laminated film in the second regions is higher than the oxygen content in the laminated film in the first regions.

(19) The display device according to any one of (14) to (18), in which in a case where it is assumed that the adsorption layer and the second electrode have the same thickness, a transmittance of the adsorption layer is higher than a transmittance of the second electrode.

(20) An electronic apparatus including: the display device according to claim 1.

(21) The display device including: a plurality of first electrodes that are two-dimensionally disposed; a second electrode that is provided to face first surfaces of the plurality of first electrodes; an electroluminescence layer that is provided between the plurality of first electrodes and the second electrode; an insulating layers that are provided between the adjacent first electrodes; a plurality of reflective plates that are provided to face second surfaces of the plurality of first electrodes, respectively; and an adsorption layer that is provided on a side of a first surface or a side of a second surface of the second electrode, in which a resonator structure that resonates light emitted from the electroluminescence layer is configured of the second electrode and each of the reflective plates, the insulating layers have a plurality of openings, the openings are provided above the first surfaces of the first electrodes, and in a case where regions corresponding to the openings in a plan view are defined as first regions, and regions corresponding to parts between the adjacent openings in the plan view are defined as second regions, an average thickness TCA of the second electrode in the first regions, an average thickness TKA of the adsorption layer in the first regions, an average thickness TCB of the second electrode in the second regions, and an average thickness TKB of the adsorption layer satisfy a relationship of TKA/TCA<TKB/TCB.

(22) A method for manufacturing a display device including forming reflective plates that configure a resonator structure, in which the formation of the reflective plates includes forming base layers and forming reflective layers on the base layers such that peripheral edges of the reflective plates are located outside peripheral edges of the base layers.

(23) A method for manufacturing a display device including: deposition-forming electrodes that configure a resonator structure by using a first deposition source; and deposition-forming an adsorption layer that is located on a side of a first surface or a side of a second surface of the electrodes by using a second deposition source, in which the offset amount of the first deposition source with respect to the substrate in the forming of the electrode layer and the offset amount of the second deposition source with respect to the substrate in the forming of the adsorption layer differ from each other.

(24) The method for manufacturing a display device according to (23), in which the offset amount of the second deposition source with respect to the substrate in the forming of the adsorption layer is larger than the offset amount of the first deposition source with respect to the substrate in the forming of the electrode layer.

REFERENCE SIGNS LIST 10, 30, 40, 50, 60, 70, 80, 90 Display device
11 Drive substrate
11A Substrate
11B Thin-film transistor
11C Gate electrode
11D Drain electrode
11E Source electrode
11F Gate insulating layer
11G Semiconductor layer
11H Interlayer insulating layer
12 Insulating layer
12A Contact plug
12B First insulating layer
12C Second insulating layer
12D Third insulating layer
12E Placement layer
13, 33, 53, 63, 93 Reflective plate
13A, 53A, 63A, 93A Base layer
13B, 33B, 53B, 63B, 93B Reflective layer
13B1 Inner part
13B2 Peripheral edge part
13S, 33S, 53S Counter surface
14 Optical adjustment layer
14A Optical path length adjustment layer
14B Optical path length adjustment layer
14C Optical path length adjustment layer
15 First electrode
16 Inter-pixel insulating layer
16A Opening
17 Organic EL layer
18 Second electrode
18M Deposition source
19 Protective layer
20 Filling resin layer
21 Counter substrate
33St, 91St Step
33SA, 53SA, 91Sa Side surface
63B2 Light absorption layer
81 Microlens
91 Absorption layer
91M Deposition source
92 Laminated film
100R, 100G, 100B Organic EL element
101R, 101G, 101B Sub-pixel
102R, 102G, 102B Resonator structure
310 Digital still camera (electronic apparatus)
320 Head-mounted display (electronic apparatus)
330 Television device (electronic apparatus)
A1, B1 First region
A2, B2 Second region
A3 Third region

The invention claimed is:

1. A display device comprising:
a plurality of first electrodes that are two-dimensionally disposed;
a second electrode that is provided to face first surfaces of the plurality of first electrodes;
an electroluminescence layer that is provided between the plurality of first electrodes and the second electrode;
insulating layers that are provided between the adjacent first electrodes; and
a plurality of reflective plates that are provided to face second surfaces of the plurality of first electrodes, respectively,
wherein a plurality of resonator structures for resonating light emitted from the electroluminescence layer are configured of the second electrode and the plurality of reflective plates,
the insulating layers have a plurality of openings,
the openings are provided above the first surfaces of the first electrodes,
the reflective plates have counter surfaces that face the electroluminescence layer via the first electrodes, and
in a case where regions corresponding to the openings in a plan view are defined as first regions and regions corresponding to peripheral edge parts of the openings in the plan view are defined as second regions, a reflectance R1 on the counter surfaces in the first region and a reflectance R2 on the counter surfaces in the second regions satisfy a relationship of R2<R1.

2. The display device according to claim 1, wherein the electroluminescence layer is provided commonly for all sub-pixels.

3. The display device according to claim 1, wherein crystallinity of the reflective plates differs between the first regions and the second regions.

4. The display device according to claim 1, wherein the reflective plates include base layers and reflective layers provided on the base layers.

5. The display device according to claim 4,
wherein the base layers are provided in the first regions, and
the reflective layers are provided in the first regions and the second regions.

6. The display device according to claim 4,
wherein the base layers are provided in the first regions and the second regions, and
the reflective layers are provided in the first regions.

7. The display device according to claim 4,
wherein the base layers contain at least one kind selected from a group consisting of titanium, titanium nitride, and titanium oxide, and
the reflective layers contain at least one kind selected from a group consisting of aluminum and an aluminum alloy.

8. The display device according to claim 1, wherein the counter surfaces have steps at boundaries between the first regions and the second regions, the steps are raised from the second regions toward the first regions, and boundary portions between the counter surfaces in the first regions and side surfaces of the steps have rounded shapes.

9. The display device according to claim 1, wherein sizes of irregularity on the counter surfaces differ between the first regions and the second regions.

10. The display device according to claim 1,
wherein the reflective plates are adjacent to the second surfaces of the first electrodes, and
the thickness of the first electrodes differs for sub-pixels of each color.

11. The display device according to claim 1, wherein the reflective plates include reflective layers provided in the first regions and light absorption layers provided in the second regions.

12. The display device according to claim 1, further comprising:
placement layers that are provided on a side further away than the reflective plates when seen from the first electrodes,
wherein the placement layers each have a counter surface that faces the electroluminescence layer,
in a case where regions corresponding to parts between the adjacent reflective plates in the plan view are defined as third regions, at least a part of the placement layers is provided in the third regions, and
the reflectance R1 and a reflectance R3 in the counter surface of the placement layers in the third regions satisfy a relationship of R3<R1.

13. The display device according to claim 1, further comprising:
an optical layer that is provided on a side of a first surface or a side of a second surface of the second electrode,
wherein the second electrode and the optical layer configure a laminated film, and
a reflectance R4 on the laminated film in the first regions and a reflectance R5 on the laminated film in the second regions satisfy a relationship of R5<R4.

14. A display device comprising:
a plurality of first electrodes that are two-dimensionally disposed;
a second electrode that is provided to face first surfaces of the plurality of first electrodes;
an electroluminescence layer that is provided between the plurality of first electrodes and the second electrode;
insulating layers that are provided between the adjacent first electrodes;
a plurality of reflective plates that are provided to face second surfaces of the plurality of first electrodes, respectively; and
an adsorption layer that is provided on a side of a first surface or a side of a second surface of the second electrode,
wherein a resonator structure that resonates light emitted from the electroluminescence layer is configured of the second electrode and each of the reflective plates,
the insulating layers have a plurality of openings,
the openings are provided above the first surfaces of the first electrodes,
the second electrode and the adsorption layer configure a laminated film, and
in a case where regions corresponding to the openings in a plan view are defined as first regions, and regions corresponding to parts between the adjacent openings in the plan view are defined as second regions, a transmittance of the laminated film in the second regions is higher than a transmittance of the laminated film in the first regions.

15. The display device according to claim 14, wherein an average thickness TCA of the second electrode in the first regions, an average thickness TKA of the adsorption layer in the first regions, an average thickness TCB of the second electrode in the second regions, and an average thickness TKB of the adsorption layer satisfy a relationship of TKA/TCA<TKB/TCB.

16. The display device according to claim 14,
wherein the second surface of the second electrode faces the first electrodes, and
the adsorption layer is provided on the side of the first surface of the second electrode.

17. The display device according to claim 14,
wherein the second surface of the second electrode faces the first electrodes, and
the adsorption layer is provided on the side of the second surface of the second electrode.

18. The display device according to claim 14, wherein an oxygen content in the laminated film in the second regions is higher than an oxygen content in the laminated film in the first regions.

19. The display device according to claim 14, wherein in a case where it is assumed that the adsorption layer and the second electrode have the same thickness, a transmittance of the adsorption layer is higher than a transmittance of the second electrode.

20. An electronic apparatus comprising the display device according to claim 1.

* * * * *